US012707857B2

(12) United States Patent
Yi et al.

(10) Patent No.: US 12,707,857 B2
(45) Date of Patent: Aug. 11, 2026

(54) DISPLAY SUBSTRATE AND PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Hong Yi, Beijing (CN); Tiaomei Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 513 days.

(21) Appl. No.: 18/282,559

(22) PCT Filed: Aug. 23, 2022

(86) PCT No.: PCT/CN2022/114308
§ 371 (c)(1),
(2) Date: Sep. 18, 2023

(87) PCT Pub. No.: WO2023/051103
PCT Pub. Date: Apr. 6, 2023

(65) Prior Publication Data

US 2024/0172522 A1 May 23, 2024

(30) Foreign Application Priority Data

Sep. 29, 2021 (CN) .......................... 202111154938.5

(51) Int. Cl.
*H10K 59/80* (2023.01)
*H10K 59/12* (2023.01)
(Continued)

(52) U.S. Cl.
CPC ... *H10K 59/80515* (2023.02); *H10K 59/1201* (2023.02); *H10K 59/124* (2023.02); *H10K 59/35* (2023.02); *H10K 59/40* (2023.02)

(58) Field of Classification Search
CPC ......... H10K 59/80515; H10K 59/1201; H10K 59/124; H10K 59/35; H10K 59/40; H10K 59/123; H10D 84/01; H10D 86/00
See application file for complete search history.

(56) References Cited

U.S. PATENT DOCUMENTS

2007/0132364 A1* 6/2007 Ahn .................. H10K 59/1275 257/E27.111
2019/0259967 A1* 8/2019 Yang .................... G06F 1/1652
(Continued)

FOREIGN PATENT DOCUMENTS

CN 1984516 A 6/2007
CN 109686758 A 4/2019
(Continued)

OTHER PUBLICATIONS

International Search Report for PCT/CN2022/114308 Mailed Nov. 23, 2022.

*Primary Examiner* — S M Sohel Imtiaz

(57) ABSTRACT

Disclosed is a display substrate, comprising a base, and a semiconductor layer, a fourth conductive layer, a second flat layer, and an anode layer sequentially provided on the base. The fourth conductive layer comprises a first anode connection electrode and a second anode connection electrode. The second flat layer comprises a first opening and a second opening. The anode layer comprises a first anode and a second anode. The first anode connection electrode is connected to the first anode through the first opening. The second anode connection electrode is connected to the second anode through the second opening. The area of an orthographic projection of the first anode connection elec-
(Continued)

trode on the base is greater than that of the second anode connection electrode on the base. The area of an orthographic projection of the first opening on the base is greater than that of the second opening on the base.

20 Claims, 26 Drawing Sheets

(51) Int. Cl.

| | |
|---|---|
| ***H10K 59/124*** | (2023.01) |
| *H10K 59/35* | (2023.01) |
| *H10K 59/40* | (2023.01) |

(56) References Cited

U.S. PATENT DOCUMENTS

| | | | | |
|---|---|---|---|---|
| 2021/0233973 | A1* | 7/2021 | Han | H10K 59/60 |
| 2021/0280660 | A1* | 9/2021 | Chen | H10D 86/60 |
| 2021/0335990 | A1* | 10/2021 | Chen | H10K 10/482 |
| 2022/0013612 | A1* | 1/2022 | Xu | H10K 59/1213 |
| 2022/0020827 | A1* | 1/2022 | Liu | H10K 59/352 |
| 2022/0115483 | A1* | 4/2022 | Li | H10K 71/00 |
| 2022/0165833 | A1* | 5/2022 | Li | H10K 59/80522 |
| 2022/0238630 | A1* | 7/2022 | Yang | H10K 59/1315 |
| 2022/0285472 | A1* | 9/2022 | Wang | H10K 59/131 |
| 2022/0320244 | A1* | 10/2022 | Shang | H10K 59/1213 |
| 2022/0320246 | A1* | 10/2022 | Wang | H10K 59/131 |
| 2022/0328579 | A1* | 10/2022 | Shang | H10K 59/30 |
| 2022/0392987 | A1* | 12/2022 | Liu | H10K 59/1213 |

FOREIGN PATENT DOCUMENTS

| | | | | |
|---|---|---|---|---|
| CN | 110429116 | A | | 11/2019 |
| CN | 110649068 | A | | 1/2020 |
| CN | 210516730 | U | | 5/2020 |
| CN | 111312077 | A | | 6/2020 |
| CN | 211150599 | U | * | 7/2020 |
| CN | 111739926 | A | | 10/2020 |
| CN | 212010974 | U | | 11/2020 |
| CN | 112750861 | A | | 5/2021 |
| CN | 112823422 | A | | 5/2021 |
| CN | 216719948 | U | | 6/2022 |
| CN | 115911050 | A | | 4/2023 |
| KR | 10-2007-0062250 | A | | 6/2007 |

* cited by examiner

DISPLAY SUBSTRATE AND PREPARATION METHOD THEREFOR, AND DISPLAY APPARATUS

CROSS-REFERENCE TO RELATED APPLICATIONS

The present application is a U.S. National Phase Entry of International Application No. PCT/CN2022/114308 having an international filing date of Aug. 23, 2022, which claims priority to Chinese patent application No. 2021111549385, entitled "Display Substrate and Preparation Method therefor, and Display Apparatus", and filed to the CNIPA on Sep. 29, 2021. The entire contents of the above-identified applications are hereby incorporated by reference.

TECHNICAL FIELD

Embodiments of the present disclosure relate to, but are not limited to, the field of display technologies, and particularly to a display substrate and a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT for short) has become a mainstream product in the field of display at present.

SUMMARY

The embodiments of the present disclosure provide a display substrate and a preparation method therefor, and a display apparatus, which can improve a display effect.

An embodiment of the present disclosure provides a display substrate, including a base substrate, a semiconductor layer, a fourth conductive layer, a second planarization layer, and an anode layer sequentially disposed on the base substrate; the semiconductor layer includes active layers of multiple transistors, the fourth conductive layer includes a first anode connection electrode and a second anode connection electrode, the second planarization layer includes a first opening and a second opening, the anode layer includes a first anode and a second anode, the first anode connection electrode is connected with the first anode through the first opening, and the second anode connection electrode is connected with the second anode through the second opening; an area of an orthographic projection of the first anode connection electrode on the base substrate is greater than an area of an orthographic projection of the second anode connection electrode on the base substrate and an area of an orthographic projection of the first opening on the base substrate is greater than an area of an orthographic projection of the second opening on the base substrate.

In an exemplary implementation mode, the first anode connection electrode includes an electrode main body part and an electrode protrusion part disposed on the electrode main body part, wherein there is an overlapping region between an orthographic projection of the electrode main body part on the base substrate and an orthographic projection of the first anode on the base substrate and there is no overlapping region between an orthographic projection of the electrode protrusion part on the base substrate and the orthographic projection of the first anode on the base substrate.

In an exemplary implementation mode, the base substrate is further provided with a third conductive layer, the third conductive layer includes multiple first connection electrodes, and there is an overlapping region between the orthographic projection of the electrode protrusion part on the base substrate and an orthographic projection of the first connection electrodes on the base substrate, wherein in a plane perpendicular to the display substrate, the display substrate further includes a first planarization layer disposed between the third conductive layer and the fourth conductive layer, and the electrode protrusion part is connected with the first connection electrodes through a via on the first planarization layer.

In an exemplary implementation mode, there is an overlapping region between the orthographic projection of the second anode connection electrode on the base substrate and the orthographic projection of the first connection electrodes on the base substrate and the second anode connection electrode is connected with the first connection electrodes through a via on the first planarization layer.

In an exemplary implementation mode, the second anode includes an anode main body part and an anode protrusion part disposed on the anode main body part, there is no overlapping region between an orthographic projection of the anode main body part on the base substrate and the orthographic projection of the second anode connection electrode on the base substrate, there is an overlapping region between an orthographic projection of the anode protrusion part on the base substrate and the orthographic projection of the second anode connection electrode on the base substrate, the second anode connection electrode is connected with the anode protrusion part through the second opening.

In an exemplary implementation mode, the display substrate includes multiple pixel units, at least one of the pixel units includes multiple sub-pixels, at least one of the sub-pixels includes a circuit unit and a light emitting device, at least one of light emitting devices includes a red light emitting device that emits red light, a blue light emitting device that emits blue light, and a green light emitting device that emits green light, at least one of circuit units includes a first circuit unit connected with the red light emitting device, a second circuit unit connected with the blue light emitting device, and a third circuit unit connected with the green light emitting device; the first circuit unit includes a first anode connection electrode and the red light emitting device includes a first anode; the second circuit unit includes a second anode connection electrode; the third circuit unit includes a second anode connection electrode, and the blue light emitting device and/or the green light emitting device includes a second anode.

In an exemplary implementation mode, at least one of the pixel units includes one first circuit unit, one second circuit unit, and two third circuit units, multiple circuit units form multiple unit rows and multiple unit columns, the unit columns include a first unit column and a second unit column, the first unit column includes multiple first circuit units and second circuit units alternately arranged along a second direction, and the second unit column includes multiple third circuit units arranged along the second direction.

In an exemplary implementation mode, the base substrate is further provided with a third conductive layer, the third conductive layer includes a first branch of the first power line, and the fourth conductive layer further includes a second branch of the first power line, wherein there is an overlapping region between an orthographic projection of the first branch of the first power line on the base substrate and an orthographic projection of the second branch of the first power line on the base substrate; the first branch of the first power line is electrically connected with the second branch of the first power line through a via.

In an exemplary implementation mode, in a plane perpendicular to the display substrate, the display substrate further includes a touch structure layer disposed on the anode layer, the touch structure layer includes multiple grid patterns, and at least one of the grid patterns includes a first touch branch, wherein there is an overlapping region between an orthographic projection of the first touch branch on the base substrate and the orthographic projection of the second branch of the first power line on the base substrate and there is no overlapping region between the orthographic projection of the first touch branch on the base substrate and the orthographic projection of the first branch of the first power line on the base substrate.

In an exemplary implementation mode, at least one of the grid patterns includes a second touch branch, wherein there is an overlapping region among three, that is, an orthographic projection of the second touch branch on the base substrate, the orthographic projection of the second branch of the first power line on the base substrate and the orthographic projection of the first branch of the first power line on the base substrate.

In an exemplary implementation mode, the fourth conductive layer further includes a power connection electrode, wherein the power connection electrode extends along a first direction, the second branch of the first power line extends along the second direction, and second branches of two adjacent first power lines are connected through one or more of power connection electrodes.

In an exemplary implementation mode, there is no overlapping region between an orthographic projection of the first anode on the base substrate and the orthographic projection of the second branch of the first power line on the base substrate; there is an overlapping region between an orthographic projection of the second anode on the base substrate and the orthographic projection of the second branch of the first power line on the base substrate.

In an exemplary implementation mode, the second branch of the first power line is provided with a bending part, and the bending part is configured such that a distance of second branches of two first power lines on both sides of the first anode along the first direction in a region of the first anode is greater than a distance along the first direction in a region other than the region of the first anode.

In an exemplary implementation mode, a width of the second branch of the first power line in a region close to the first anode is smaller than a width of the second branch of the first power line in a region away from the first anode.

An embodiment of the present disclosure also provides a display apparatus, including any one of the above display substrates.

An embodiment of the present disclosure also provides a preparation method of a display substrate, including: forming a semiconductor layer on a base substrate, wherein the semiconductor layer includes active layers of multiple transistors; forming a fourth conductive layer on the semiconductor layer, wherein the fourth conductive layer includes a first anode connection electrode and a second anode connection electrode; forming a second planarization layer on the fourth conductive layer, wherein the second planarization layer includes a first opening and a second opening; and forming an anode layer on the second planarization layer, wherein the anode layer includes a first anode and a second anode, the first anode connection electrode is connected with the first anode through the first opening, and the second anode connection electrode is connected with the second anode through the second opening; an area of an orthographic projection of the first anode connection electrode on the base substrate is greater than an area of an orthographic projection of the second anode connection electrode on the base substrate and an area of an orthographic projection of the first opening on the base substrate is greater than an area of an orthographic projection of the second opening on the base substrate.

According to the display substrate and the preparation method therefor, and the display apparatus of the embodiments of the present disclosure, the area of the orthographic projection of the first anode connection electrode on the base substrate is greater than the area of the orthographic projection of the second anode connection electrode on the base substrate and the area of the orthographic projection of the first opening on the base substrate is greater than the area of the orthographic projection of the second opening on the base substrate, so that not only a light transmittance is effectively improved, but also a light emitting efficiency of a light emitting device is effectively improved, power consumption is saved, and a display effect is improved. In addition, a preparation process of the present disclosure may be compatible well with an existing preparation process, which is simple in process implementation, is easy to implement, and has a high production efficiency, a low production cost, and a high yield.

Other features and advantages of the present disclosure will be set forth in following specification, and moreover, partially become apparent from the specification or are understood by implementing the present disclosure. Other advantages of the present disclosure may be achieved and obtained through solutions described in the specification and drawings.

BRIEF DESCRIPTION OF DRAWINGS

The accompanying drawings are used for providing understanding of technical solutions of the present disclosure, and constitute a part of the specification. They are used for explaining the technical solutions of the present disclosure together with embodiments of the present disclosure, but do not constitute limitations on the technical solutions of the present disclosure.

DETAILED DESCRIPTION

Figure 1:
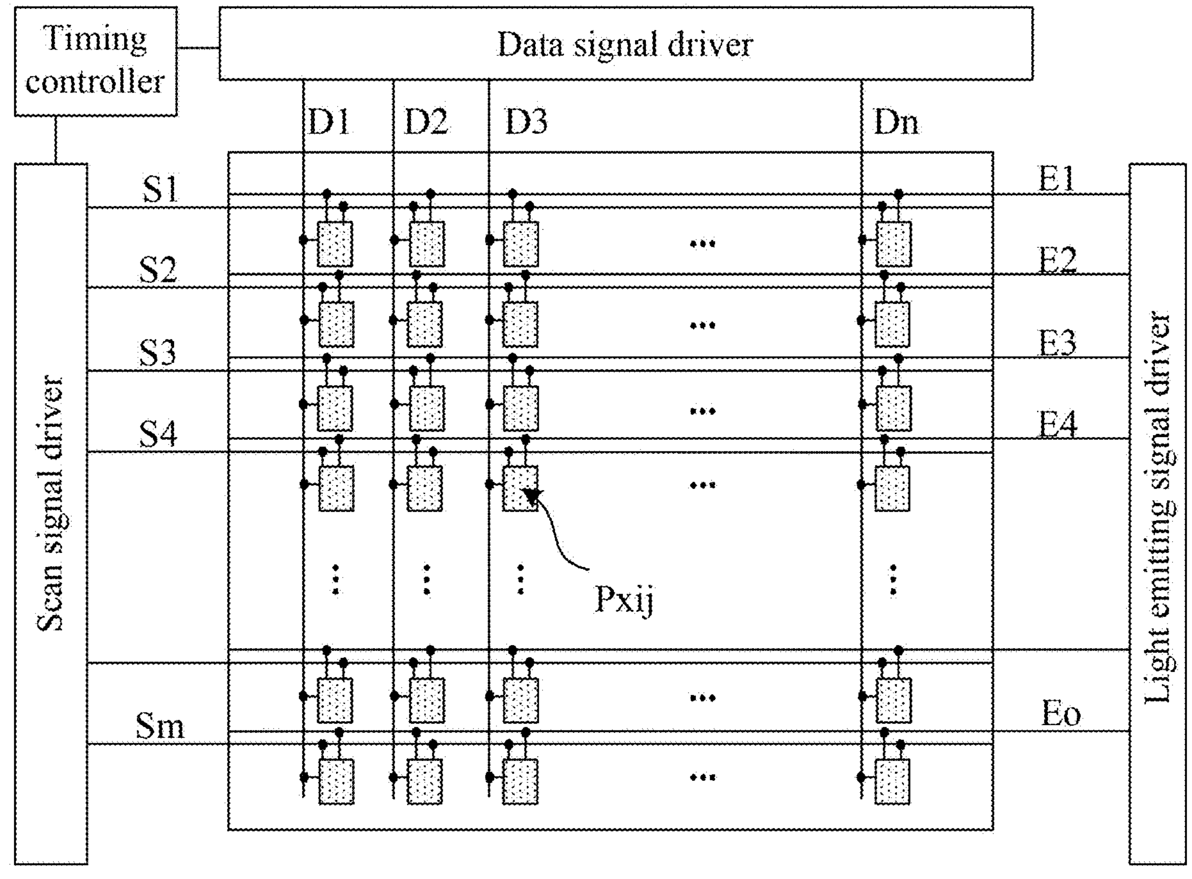
FIG. 1 is a schematic diagram of a structure of a display apparatus according to an embodiment of the present disclosure.

To make objectives, technical solutions, and advantages of the present disclosure clearer, the embodiments of the present disclosure will be described in detail with reference to the accompanying drawings. It is to be noted that an implementation mode may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of a constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as “first”, “second”, and “third” in the specification are set to avoid confusion between constituent elements, but not to set a limit in quantity.

In the specification, for convenience, wordings indicating orientations or positional relationships, such as “middle”, “upper”, “lower”, “front”, “back”, “vertical”, “horizontal”, “top”, “bottom”, “inside”, and “outside”, are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing various constituent elements. Therefore, appropriate replacements may be made according to situations without being limited to the wordings described in the specification.

In the specification, unless otherwise specified and defined explicitly, terms “mount”, “mutually connect”, and “connect” should be understood in a broad sense. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skills in the art may understand specific meanings of these terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode and a second electrode may be a source electrode. Or, a first electrode may be a source electrode and a second electrode may be a drain electrode. In a case that transistors with opposite polarities are used, in a case that a direction of a current is changed during operation of a circuit, or the like, functions of the "source electrode" and the "drain electrode" are sometimes interchangeable. Therefore, in the specification, the "source electrode" and the "drain electrode" are interchangeable.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is not defined so strictly and numerical values within process and measurement error ranges are allowed.

FIG. 1 is a schematic diagram of a structure of a display apparatus. As shown in FIG. 1, an OLED display apparatus may include a timing controller, a data signal driver, a scan signal driver, a light emitting signal driver, and a pixel array. The pixel array may include multiple scan signal lines (S1 to Sm), multiple data signal lines (D1 to Dn), multiple light emitting signal lines (E1 to Eo), and multiple sub-pixels Pxij. In some exemplary implementation modes, the timing controller may provide a gray scale value and a control signal which are suitable for a specification of the data signal driver, to the data signal driver, may provide a clock signal, a scan start signal, etc., which are suitable for a specification of the scan signal driver, to the scan signal driver, and may provide a clock signal, an emission stop signal, etc., which are suitable for a specification of the light emitting signal driver, to the light emitting signal driver. The data signal driver may generate a data voltage to be provided to the data signal lines D1, D2, D3, . . . , and Dn using the gray scale value and the control signal received from the timing controller. For example, the data signal driver may sample the gray scale value using a clock signal, and apply a data voltage corresponding to the gray scale value to the data signal lines D1 to Dn by taking a pixel row as a unit, wherein n may be a natural number. The scan signal driver may generate a scan signal to be provided to the scan signal lines S1, S2, S3, . . . , and Sm by receiving a clock signal, a scan start signal, and the like from the timing controller. For example, the scan signal driver may sequentially provide a scan signal with an on-level pulse to the scan signal lines S1 to Sm. For example, the scan signal driver may be constructed in a form of a shift register and generate a scan signal in a manner of sequentially transmitting a scan start signal provided in a form of an on-level pulse to a next-stage circuit under control of a clock signal, wherein m may be a natural number. The light emitting signal driver may generate an emission signal to be provided to the light emitting signal lines E1, E2, E3, . . . , and Eo by receiving the clock signal, the emission stop signal, and the like from the timing controller. For example, the light emitting signal driver may sequentially provide an emission signal with an off-level pulse to the light emitting signal lines E1 to Eo. For example, the light emitting signal driver may be constructed in a form of a shift register, and generate a light emitting signal in a manner of sequentially transmitting a light emitting stop signal provided in a form of an off-level pulse to a next-stage circuit under control of a clock signal, wherein o may be a natural number. The pixel array may include multiple sub-pixels Pxij. Each sub-pixel Pxij may be connected to a corresponding data signal line, a corresponding scan signal line, and a corresponding light emitting signal line, wherein i and j may be natural numbers. The sub-pixel Pxij may refer to a sub-pixel in which a transistor is connected to an i-th scan signal line and connected to a j-th data signal line.

Figure 2A:
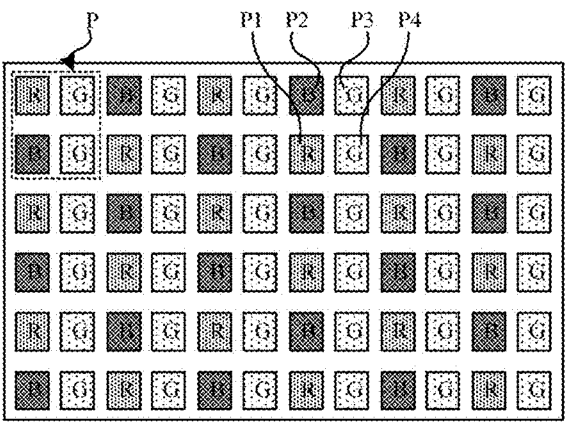
FIG. 2*a* and FIG. 2*b* are schematic diagrams of structures of pixel arrangements of two types of display panels according to an embodiment of the present disclosure.
Figure 2B:
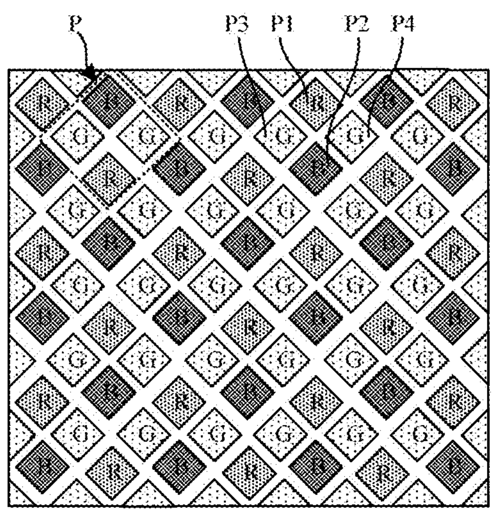

FIG. 2*a* and FIG. 2*b* are schematic diagrams of a planar structure of a display substrate. In an exemplary implementation mode, the display substrate may include multiple pixel units P arranged in a matrix manner, at least one pixel unit P may include one first sub-pixel P1 emitting light of a first color, one second sub-pixel P2 emitting light of a second color, and one third sub-pixel P3 and one fourth sub-pixel P4 emitting light of a third color. Each of the four sub-pixels may include a circuit unit and a light emitting device. The circuit unit may include a scan signal line, a data signal line, a light emitting signal line, and a pixel drive circuit. The pixel drive circuit is respectively connected with the scan signal line, the data signal line, and the light emitting signal line. The pixel drive circuit is configured to receive a data voltage transmitted by the data signal line and output a corresponding current to the light emitting device under control of the scan signal line and the light emitting signal line. The light emitting device in each sub-pixel is connected with a pixel drive circuit of the sub-pixel where the light emitting device is located, and is configured to emit light with corresponding brightness in response to a current output by the pixel drive circuit of the sub-pixel where the light emitting device is located.

In an exemplary implementation mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation mode, a sub-pixel may have a shape of a rectangle, a rhombus, a pentagon, or a hexagon. In an exemplary implementation mode, four sub-pixels may be arranged in a manner of a square to form a GGRB pixel arrangement, as shown in FIG. 2*a*. In another exemplary implementation mode, four sub-pixels may be arranged in a manner of diamond to form an RGBG pixel arrangement, as shown in FIG. 2*b*. In other exemplary implementation modes, four sub-pixels may be arranged in a manner of side by side horizontally or side by side vertically or the like. In an exemplary implementation mode, a pixel unit may include three sub-pixels, the three sub-pixels may be arranged in a manner of side by side horizontally, in a manner of side by side vertically, or in a manner like a Chinese character "品". The present disclosure is not limited thereto.

In an exemplary implementation mode, multiple sub-pixels sequentially disposed in a horizontal direction are referred to as a pixel row, and multiple sub-pixels sequentially disposed in a vertical direction are referred to as a pixel column; and multiple pixel rows and multiple pixel columns together form a pixel array arranged in an array.

Figure 3:
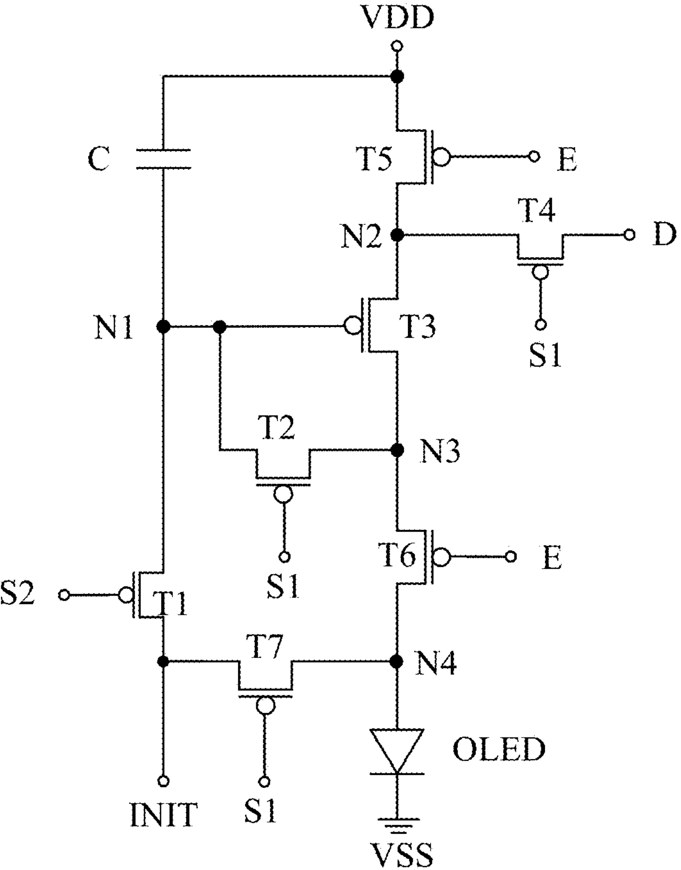
FIG. 3 is a schematic diagram of an equivalent circuit of a pixel circuit according to an embodiment of the present disclosure.

In some exemplary implementation modes, the pixel drive circuit may have a structure of 3T1C, 4T1C, 5T1C, 5T2C, 6T1C, or 7T1C. FIG. 3 is a schematic diagram of an equivalent circuit of a pixel drive circuit according to an exemplary embodiment of the present disclosure. As shown in FIG. 3, the pixel drive circuit may include seven transistors (a first transistor T1 to a seventh transistor T7), one storage capacitor C, and multiple signal lines (a data signal line D, a first scan signal line S1, a second scan signal line S2, an initial signal line INIT, a first power line VDD, a second power line VSS, and a light emitting control signal line E).

In some exemplary implementation modes, a gate electrode of the first transistor T1 is connected with the second scan signal line S2, a first electrode of the first transistor T1 is connected with the initial signal line INIT, and a second electrode of the first transistor T1 is connected with a first node N1. A gate electrode of the second transistor T2 is connected with the first scan signal line S1, a first electrode of the second transistor T2 is connected with a third node N3, and a second electrode of the second transistor T2 is connected with the first node N1. A gate electrode of the third transistor T3 is connected with the first node N1, a first electrode of the third transistor T3 is connected with a second node N2, and a second electrode of the third transistor T3 is connected with the third node N3. A gate electrode of the fourth transistor T4 is connected with the first scan signal line S1, a first electrode of the fourth transistor T4 is connected with the data signal line D, and a second electrode of the fourth transistor T4 is connected with the second node N2. A gate electrode of the fifth transistor T5 is connected with the light emitting control signal line E, a first electrode of the fifth transistor T5 is connected with the first power line VDD, and a second electrode of the fifth transistor T5 is connected with the second node N2. A gate electrode of the sixth transistor T6 is connected with the light emitting control signal line E, a first electrode of the sixth transistor T6 is connected with the third node N3, and a second electrode of the sixth transistor T6 is connected with a fourth node N4 (i.e., a first electrode of a light emitting device). A gate electrode of the seventh transistor T7 is connected with the first scan signal line S1, a first electrode of the seventh transistor T7 is connected with the initial signal line INIT, and a second electrode of the seventh transistor T7 is connected with the fourth node N4. A first terminal of the storage capacitor C is connected with the first power line VDD and a second terminal of the storage capacitor C is connected with the first node N1.

In some exemplary implementation modes, the first transistor T1 to the seventh transistor T7 may be P-type transistors or may be N-type transistors. Use of a same type of transistors in a pixel drive circuit may simplify a process flow, reduce a process difficulty of a display panel, and improve a yield of products. In some possible implementation modes, the first transistor T1 to the seventh transistor T7 may include a P-type transistor and an N-type transistor.

In some exemplary implementation modes, a second electrode of the light emitting device is connected with the second power line VSS, a signal of the second power line VSS is a low-level signal continuously provided, and a signal of the first power line VDD is a high-level signal continuously provided. The first scan signal line S1 is a scan signal line in a pixel drive circuit in a present display row, and the second scan signal line S2 is a scan signal line in a pixel drive circuit in a previous display row, that is, for an n-th display row, the first scan signal line S1 is S(n), the second scan signal line S2 is S(n−1), a second scan signal line S2 in the present display row and a first scan signal line S1 in the pixel drive circuit in the previous display row may be a same signal line, so as to reduce signal lines of the display panel and achieve a narrow bezel of the display panel.

In some exemplary implementation modes, the first scan signal line S1, the second scan signal line S2, the light emitting signal line E, and the initial signal line INIT each extend along a horizontal direction, and the second power line VSS, the first power line VDD, and the data signal line D extend along a vertical direction.

In some exemplary implementation modes, the light emitting device may be an Organic Light Emitting Diode (OLED), including a first electrode (anode), an organic emitting layer, and a second electrode (cathode) that are stacked.

Figure 4:
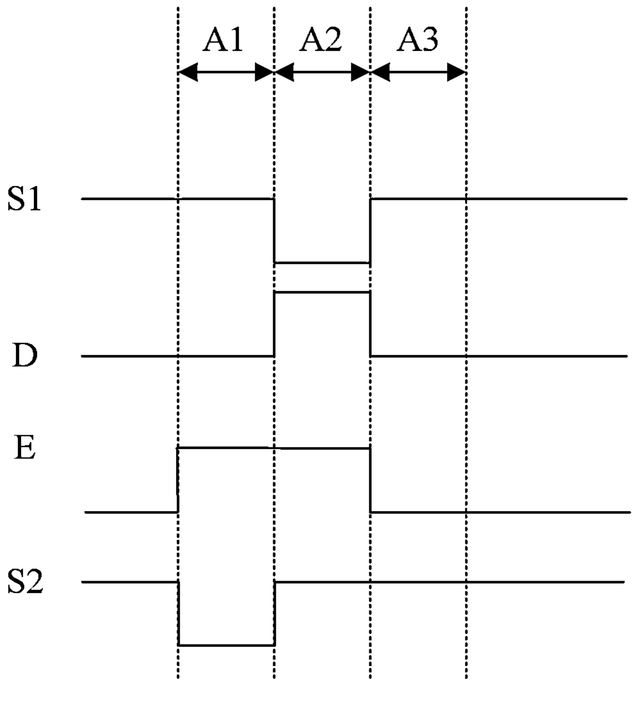
FIG. 4 is a working timing diagram of the pixel circuit shown in FIG. 3.

FIG. 4 is a working timing diagram of the pixel drive circuit shown in FIG. 3. An exemplary embodiment of the present disclosure will be described below through a working process of the pixel drive circuit shown in FIG. 4. The pixel drive circuit in FIG. 3 includes seven transistors (the first transistor T1 to the seventh transistor T7), one storage capacitor C1, and seven signal lines (a data signal line DATA, the first scan signal line S1, the second scan signal line S2, the initial signal line INIT, the first power line VDD, the second power line VSS, and a light emitting signal line EM), and the seven transistors are all P-type transistors.

In an exemplary implementation mode, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to a first node N1 to initialize a storage capacitor C to clear an original data voltage in the storage capacitor. The signals of the first scan signal line S1 and the light emitting signal line E are the high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, a second terminal of the storage capacitor C is at a low-level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on so that the data voltage output by the data signal line D is provided to the first node N1 through a second node N2, the turned-on third transistor T3, a third node N3, and the turned-on second transistor T2, and a sum of the data voltage output by the data signal line D and a threshold voltage of the third transistor T3 is charged into the storage capacitor C, wherein a voltage at the second terminal (the second node N2) of the storage capacitor C is Vdata+Vth, Vdata is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. A signal of the second scan signal line S2 is a high-level signal, so that the first transistor T1 is turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on. A power voltage output by the first power line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (a drive transistor) is determined by a voltage difference between a gate electrode and a first electrode of the third transistor T3. Since the voltage of the second node N2 is Vdata+Vth, the drive current of the third transistor T3 is as follows.

$$I=K\times(Vgs-Vth)^2=K\times[(\mathrm{Vdata}+Vth-Vdd)-Vth]^2=K\times[(V\mathrm{data}-Vdd)]^2$$

Among them, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vdata is the data voltage output by the data signal line D, and Vdd is the power voltage output by the first power line VDD.

It may be seen from the above formula that the current I flowing through a light emitting device is unrelated to the threshold voltage Vth of the third transistor T3, so that an influence of the threshold voltage Vth of the third transistor T3 on the current I is eliminated, and uniformity of brightness is ensured.

Based on the above-mentioned working timing, in this pixel circuit, residual positive charges of the light emitting device, after the light emitting device emitted light last time, are eliminated, compensation for a voltage of a gate of the third transistor is achieved, an influence of drift of the threshold voltage of the third transistor on a drive current of the light emitting device is avoided, and uniformity of a displayed image and display quality of a display panel are improved.

In recent years, with development of display technologies, more and more Active Matrix Organic Light Emitting Diode (AMOLED) display panels have entered the market. Compared with a traditional Thin Film Transistor Liquid Crystal Display (TFTLD), an AMOLED has a faster response speed, a higher contrast ratio, and a wider viewing angle. With development of display technologies, fingerprint unlocking has become a mainstream way, and a demand for optical fingerprint identification transmittance of products is also expanding. In addition, improving a display effect and reducing power consumption are main research directions of the display industry at present.

Figure 5:
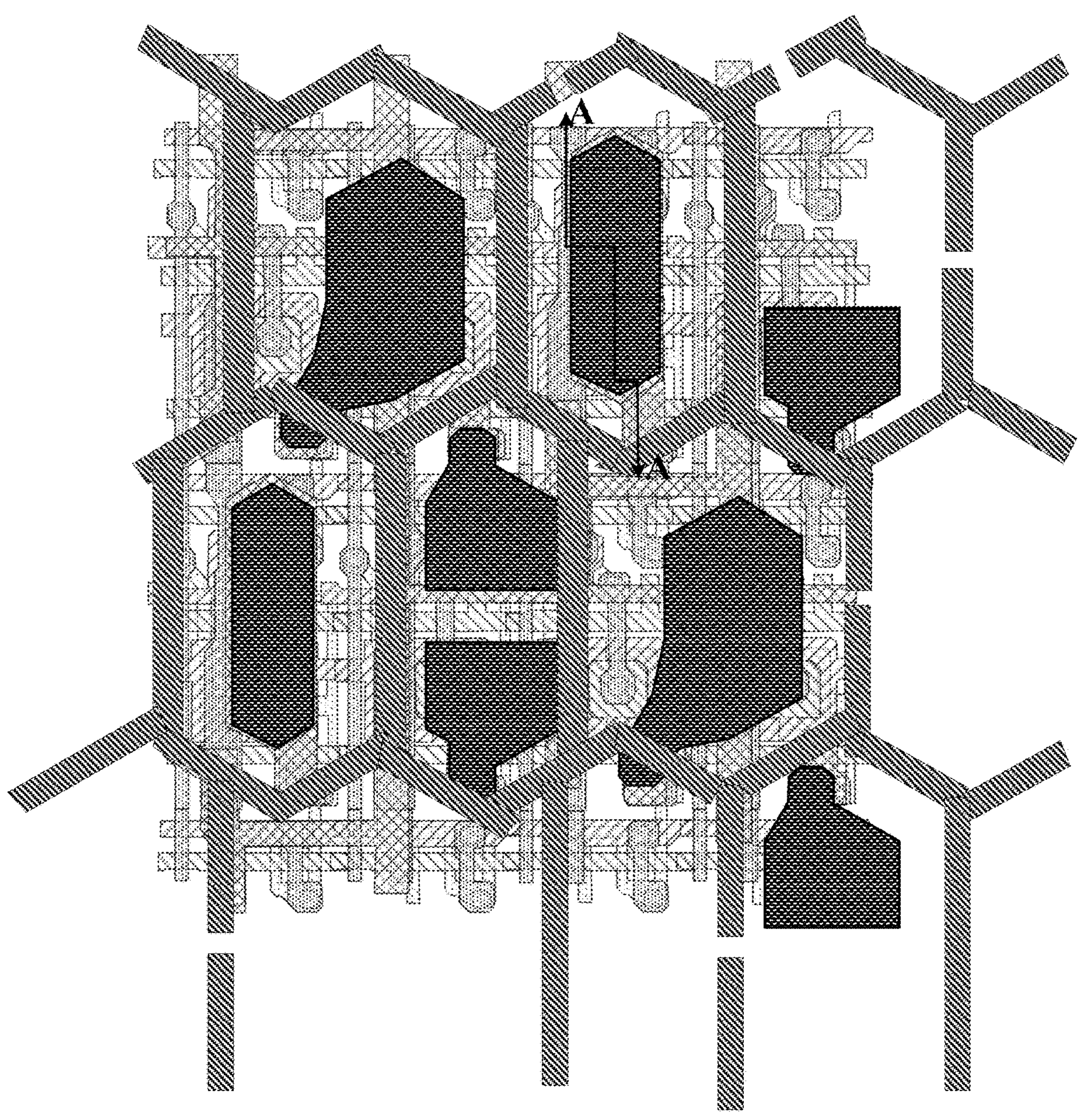
FIG. 5 is a schematic diagram of a planar structure of a display substrate according to an embodiment of the present disclosure.
Figure 6A:
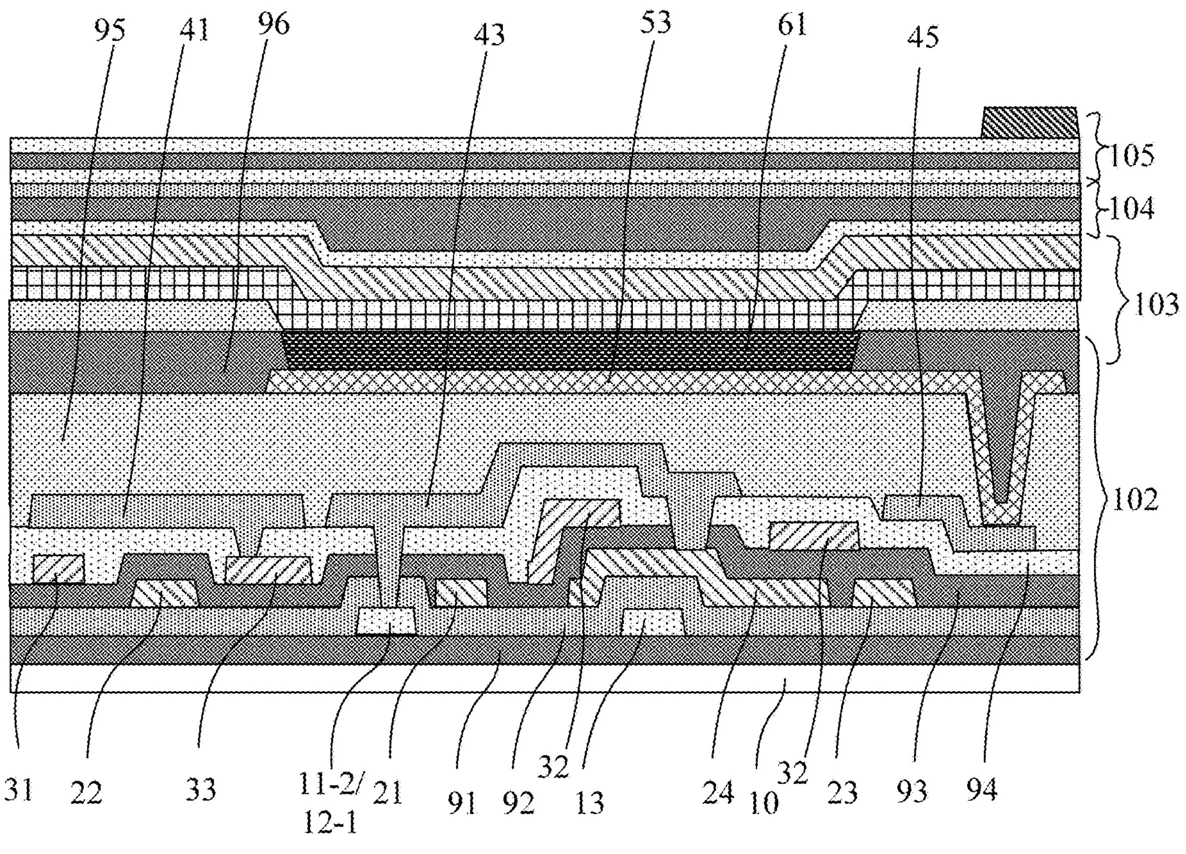
FIG. 6*a* is a sectional view along a position A-A of the display substrate shown in FIG. 5.
Figure 6B:
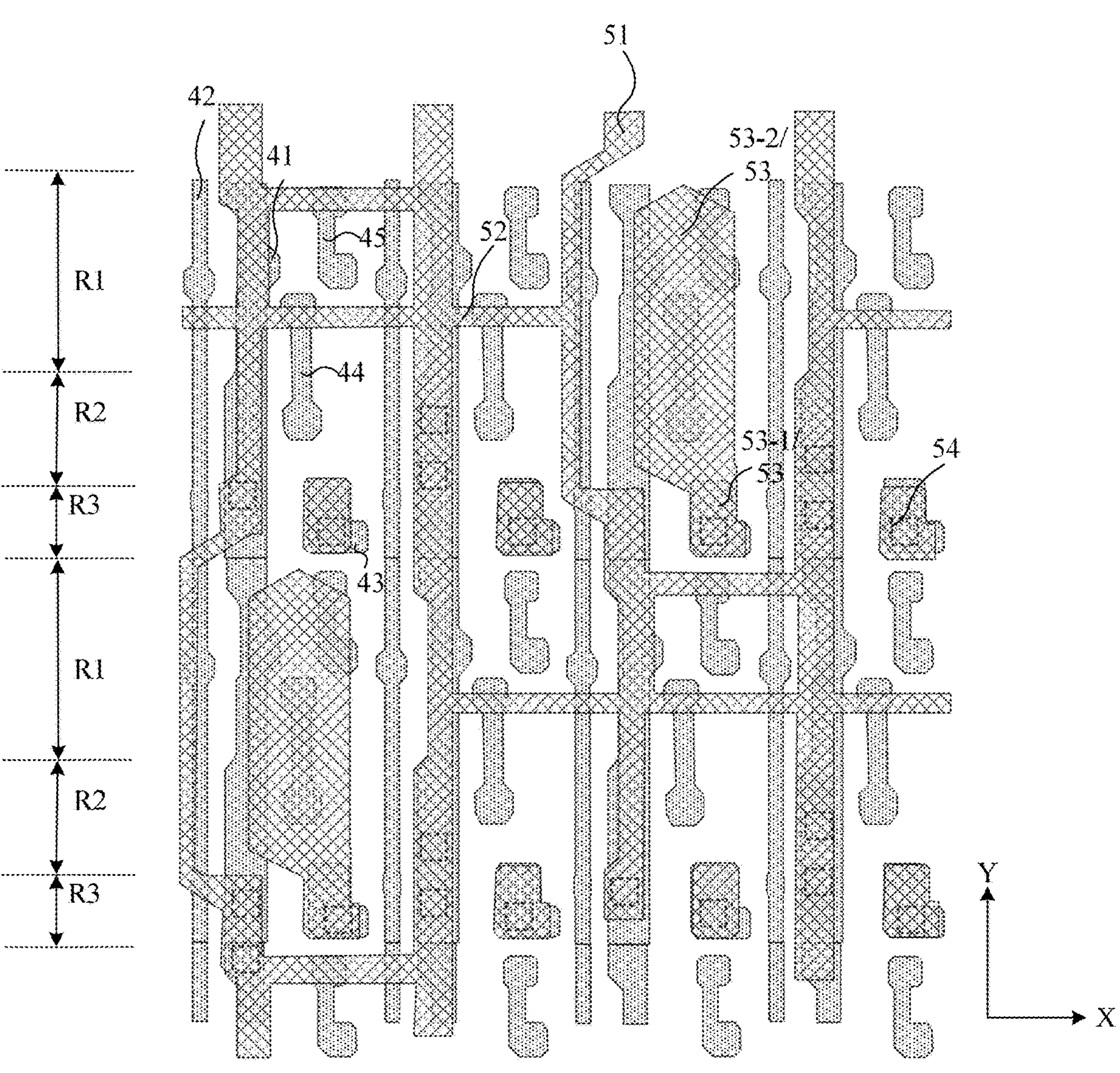
FIG. 6*b* is a schematic diagram of a stacked structure of a third conductive layer, a first planarization layer, and a fourth conductive layer in the display substrate shown in FIG. 5.
Figure 6C:
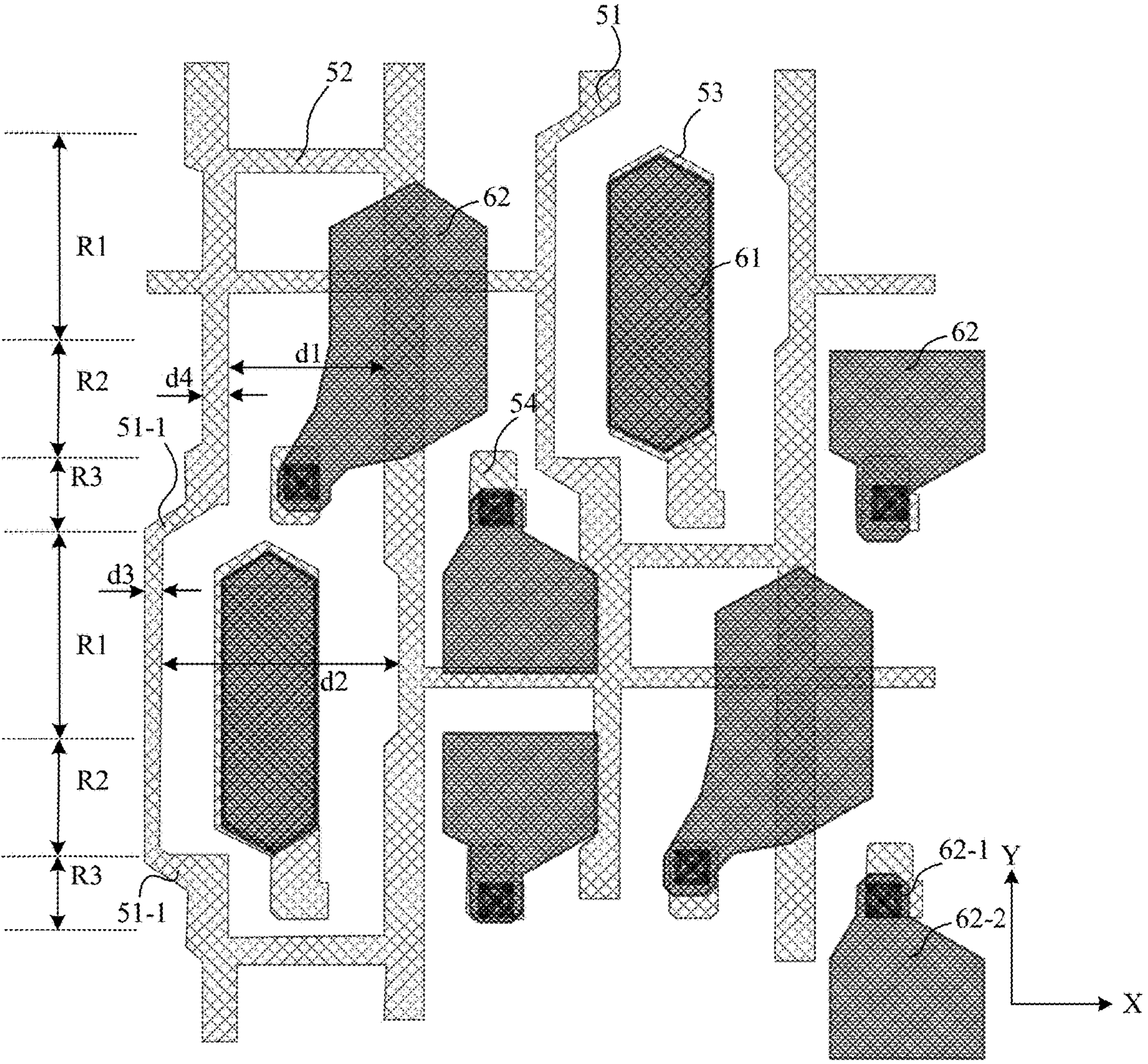
FIG. 6*c* is a schematic diagram of a stacked structure of a fourth conductive layer, a second planarization layer, and an anode layer in the display substrate shown in FIG. 5.
Figure 6D:
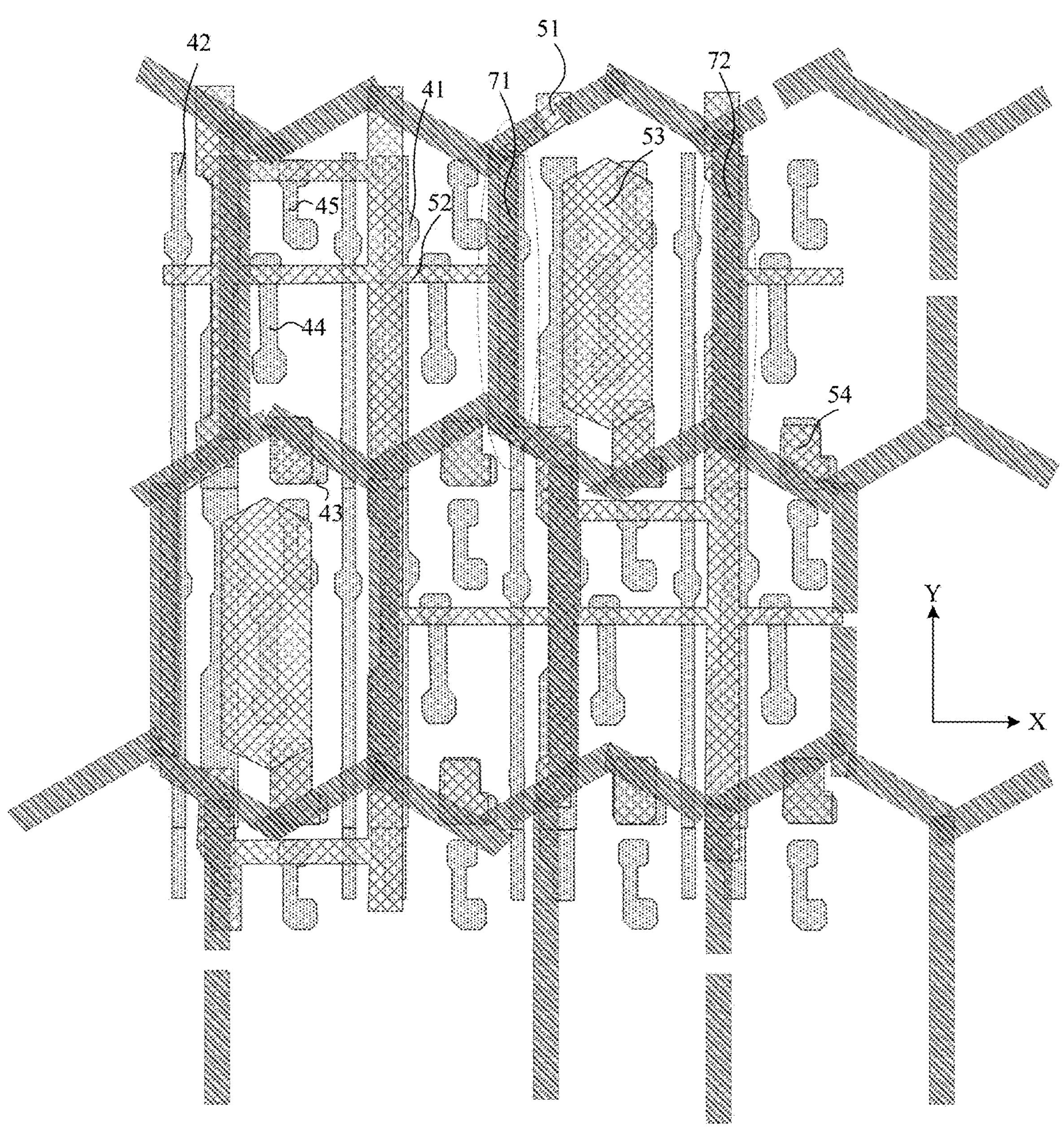
FIG. 6*d* is a schematic diagram of a stacked structure of a third conductive layer, a fourth conductive layer, and a touch structure layer in the display substrate shown in FIG. 5.

FIG. 5 is a schematic diagram of a structure of a display substrate according to an embodiment of the present disclosure, FIG. 6*a* is a sectional view along a position A-A of the display substrate shown in FIG. 5, FIG. 6*b* is a schematic diagram of a stacked structure of a third conductive layer, a first planarization layer, and a fourth conductive layer in the display substrate shown in FIG. 5, FIG. 6*c* is a schematic diagram of a stacked structure of a fourth conductive layer, a second planarization layer, and an anode layer in the display substrate shown in FIG. 5, and FIG. 6*d* is a schematic diagram of a stacked structure of a third conductive layer, a fourth conductive layer, and a touch structure layer in the display substrate shown in FIG. 5. As shown in FIG. 5, FIG. 6*a*, FIG. 6*b*, FIG. 6*c*, and FIG. 6*d*, in a plane perpendicular to the display substrate, the display substrate includes a base substrate 10, a semiconductor layer, a fourth conductive layer, a second planarization layer 96, and an anode layer disposed sequentially on the base substrate 10.

The semiconductor layer includes active layers of multiple transistors, the fourth conductive layer includes a first anode connection electrode 53 and a second anode connection electrode 54, the second planarization layer 96 includes a first opening (i.e., a twelfth via V12 described later) and a second opening (i.e., a thirteenth via V13 described later), the anode layer includes a first anode 61 and a second anode 62, the first anode connection electrode 53 is connected with the first anode 61 through the first opening, and the second anode connection electrode 54 is connected with the second anode 62 through the second opening.

An area of an orthographic projection of the first anode connection electrode 53 on the base substrate 10 is greater than an area of an orthographic projection of the second anode connection electrode 54 on the base substrate 10, and an area of an orthographic projection of the first opening on the base substrate 10 is greater than an area of an orthographic projection of the second opening on the base substrate 10.

In the display substrate according to an embodiment of the present disclosure, by making the area of the orthographic projection of the first anode connection electrode 53 on the base substrate 10 greater than the area of the orthographic projection of the second anode connection electrode 54 on the base substrate 10 and the area of the orthographic projection of the first opening on the base substrate 10 greater than the area of the orthographic projection of the second opening on the base substrate 10, not only a light transmittance may be effectively improved, but also since a square resistance of a metal of the fourth conductive layer where the first anode connection electrode 53 is located is about 0.1 times that of the anode layer, a light emitting efficiency of the light emitting device is effectively improved, power consumption is saved, and a display effect is improved.

In some exemplary implementation modes, the base substrate is further provided with a first conductive layer, a second conductive layer, and a third conductive layer. The first conductive layer includes gate electrodes of multiple transistors and a first electrode plate of a storage capacitor, the second conductive layer includes a second electrode plate of the storage capacitor, and the third conductive layer includes first electrodes and second electrodes of multiple transistors.

In some exemplary implementation modes, the first anode connection electrode 53 includes an electrode main body part 53-2 and an electrode protrusion part 53-1 disposed on the electrode main body part 53-2, there is an overlapping region between an orthographic projection of the electrode main body part 53-2 on the base substrate 10 and an orthographic projection of the first anode 61 on the base substrate 10, and there is no overlapping region between an orthographic projection of the electrode protrusion part 53-1 on the base substrate 10 and the orthographic projection of the first anode 61 on the base substrate 10.

In some exemplary implementation modes, the third conductive layer includes multiple first connection electrodes 43 and there is an overlapping region between the orthographic projection of the electrode protrusion part 53-1 on the base substrate 10 and an orthographic projection of the first connection electrode 43 on the base substrate 10.

In a plane perpendicular to the display substrate, the display substrate further includes a first planarization layer 95 disposed between the third conductive layer and the fourth conductive layer. The electrode protrusion part 53-1 is electrically connected with the first connection electrode 43 through a via on the first planarization layer 95.

In some exemplary implementation modes, there is an overlapping region between an orthographic projection of the second anode connection electrode 54 on the base substrate and the orthographic projection of the first connection electrode 43 on the base substrate 10. The second anode connection electrode 54 is connected with the first connection electrode 43 through a via on the first planarization layer 95.

In some exemplary implementation modes, the second anode 62 includes an anode main body part 62-2 and an anode protrusion part 62-1 disposed on the anode main body part 62-2, there is no overlapping region between an orthographic projection of the anode main body part 62-2 on the base substrate 10 and the orthographic projection of the second anode connection electrode 54 on the base substrate 10, and there is an overlapping region between an orthographic projection of the anode protrusion part 62-1 on the base substrate 10 and the orthographic projection of the second anode connection electrode 54 on the base substrate 10. The second anode connection electrode 54 is electrically connected with the anode protrusion part 62-1 through the second opening.

In some exemplary implementation modes, the display substrate includes multiple pixel units, each pixel unit includes multiple sub-pixels, each sub-pixel includes a circuit unit and a light emitting device, and the light emitting device includes a red light emitting device that emits red light, a blue light emitting device that emits blue light, and a green light emitting device that emits green light. The circuit unit includes a first circuit unit connected with the red light emitting device, a second circuit unit connected with the blue light emitting device, and a third circuit unit connected with the green light emitting device.

The first circuit unit includes a first anode connection electrode 53 and the red light emitting device includes a first anode 61; the second circuit unit includes a second anode connection electrode 54 and the blue light emitting device includes a second anode 62; the third circuit unit includes a second anode connection electrode 54 and the green light emitting device includes a second anode 62.

In some exemplary implementation modes, each pixel unit includes a first circuit unit, a second circuit unit, and two third circuit units, multiple circuit units form multiple unit rows and multiple unit columns, the unit columns include a first unit column and a second unit column, the first unit column includes multiple first circuit units and multiple second circuit units alternately arranged along a second direction Y, and the second unit column includes multiple third circuit units arranged along the second direction Y.

In some exemplary implementation modes, the third conductive layer further includes a first branch 41 of a first power line and the fourth conductive layer further includes a second branch 51 of the first power line, wherein there is an overlapping region between an orthographic projection of the first branch 41 of the first power line on the base substrate 10 and an orthographic projection of the second branch 51 of the first power line on the base substrate 10; the first branch 41 of the first power line is electrically connected with the second branch 51 of the first power line through a via on the first planarization layer 95.

In some exemplary implementation modes, in a plane perpendicular to the display substrate, the display substrate further includes a touch structure layer 105 disposed on the anode layer, the touch structure layer 105 includes multiple grid patterns, and at least one grid pattern includes a first touch branch 71, wherein there is an overlapping region between an orthographic projection of the first touch branch 71 on the base substrate 10 and the orthographic projection of the second branch 51 of the first power line on the base substrate 10 and there is no overlapping region between the orthographic projection of the first touch branch 71 on the base substrate 10 and the orthographic projection of the first branch 41 of the first power line on the base substrate 10.

In the display substrate according to the embodiment of the present disclosure, a trace of the first branch 41 of the first power line is overlapped as much as possible with a trace of the second branch 51 of the first power line, and in a region where the trace of the first branch 41 of the first power line cannot be overlapped with the trace of the second branch 51 of the first power line, the trace of the second branch 51 of the first power line is overlapped with a trace of a grid pattern of the touch structure layer 105, thereby effectively improving a light transmittance.

In some exemplary implementation modes, at least one grid pattern further includes a second touch branch 72, wherein there is an overlapping region among three, that is, an orthographic projection of the second touch branch 72 on the base substrate 10, the orthographic projection of the second branch 51 of the first power line on the base substrate 10, and the orthographic projection of the first branch 41 of the first power line on the base substrate 10.

In some exemplary implementation modes, the fourth conductive layer further includes a power connection electrode 52, wherein the power connection electrode 52 extends along a first direction X, the second branch 51 of the first power line extends along the second direction Y, and the second branches 51 of two adjacent first power lines are electrically connected through one or more power connection electrodes 52.

In some exemplary implementation modes, there is no overlapping region between an orthographic projection of the first anode 61 on the base substrate 10 and the orthographic projection of the second branch 51 of the first power line on the base substrate 10; there is an overlapping region between an orthographic projection of the second anode 62 on the base substrate 10 and the orthographic projection of the second branch 51 of the first power line on the base substrate 10.

In some exemplary implementation modes, the second branch 51 of the first power line is provided with a bending part 51-1 and the bending part 51-1 is configured such that a distance d2 of second branches 51 of two first power lines on both sides of the first anode 61 along the first direction X in a region of the first anode 61 is greater than a distance d1 along the first direction X in a region other than the region of the first anode 61.

In some exemplary implementation modes, a width d3 of the second branch 51 of the first power line in a region close to the first anode 61 is smaller than a width d4 of the second branch 51 of the first power line in a region away from the first anode 61.

A structure of a display substrate according to an embodiment of the present disclosure is exemplarily described below through a preparation process of the display substrate. A "patterning process" mentioned in the present disclosure includes processes such as deposition of a film layer, photoresist coating, mask exposure, development, etching, and photoresist stripping. Deposition may be any one or more of sputtering, evaporation, and chemical vapor deposition, coating may be any one or more of spray coating and spin coating, and etching may be any one or more of dry etching and wet etching. A "thin film" refers to a layer of a thin film prepared from a material on a base substrate using a process of deposition or coating. If the "thin film" does not need a patterning process in an entire preparation process, the "thin film" may also be called a "layer". If the "thin film" needs a patterning process in the entire preparation process, the "thin film" is called a "thin film" before the patterning process and is called a "layer" after the patterning process. The "layer" after the patterning process includes at least one "pattern". "A and B are disposed in a same layer" mentioned in the present disclosure means that A and B are simultaneously formed through a same patterning process. "An orthographic projection of A contains an orthographic projection of B" means that the orthographic projection of B falls within a range of the orthographic projection of A, or the orthographic projection of A covers the orthographic projection of B.

In some exemplary embodiments, the preparation process of the display substrate shown in FIG. 6*a* and FIG. 6*b* may include following acts.

Figure 7:
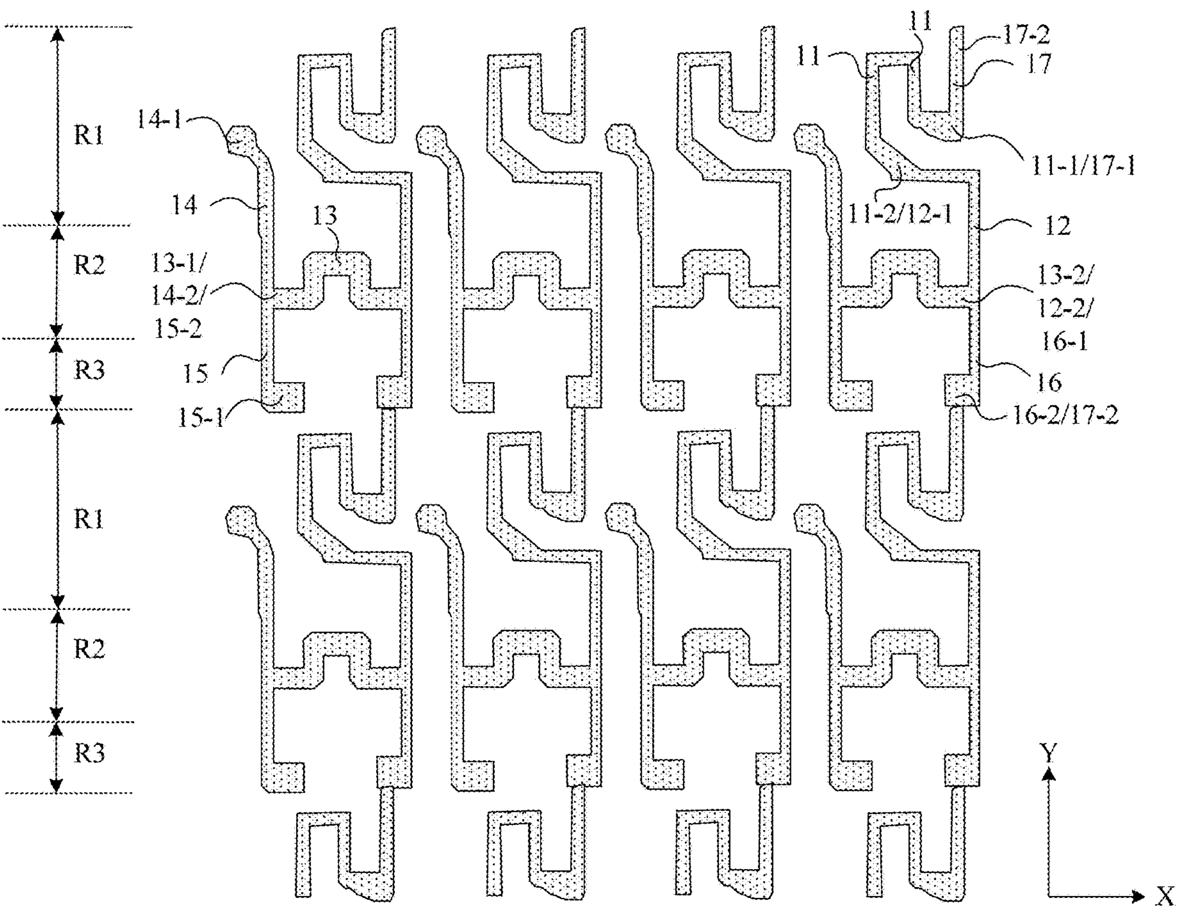
FIG. 7 is a schematic diagram of a structure of the display substrate shown in FIG. 5 after a semiconductor layer is formed.

(1) In an exemplary embodiment, forming a pattern of a semiconductor layer may include: depositing sequentially a first insulation thin film and a semiconductor thin film on a base substrate 10, and patterning the semiconductor thin film through a patterning process to form a first insulation layer 91 covering the base substrate 10 and a semiconductor layer disposed on the first insulation layer 91, as shown in FIG. 7.

In an exemplary embodiment, the semiconductor layer of each sub-pixel may include a first active layer 11 of a first transistor T1 to a seventh active layer 17 of a seventh transistor T7, and the first active layer 11 to the seventh active layer 17 are of an integral structure connected with one another.

In an exemplary embodiment, a first region R1 may include at least a portion of the first active layer 11 of the first transistor T1, the second active layer 12 of the second transistor T2, the fourth active layer 14 of the fourth transistor T4, and the seventh active layer 17 of the seventh transistor T7, a second region R2 may include at least a portion of the third active layer 13 of the third transistor T3, and a third region R3 may include at least a portion of the fifth active layer of the fifth transistor T5 and the sixth active layer 16 of the sixth transistor T6. The first active layer 11 and the seventh active layer 17 are disposed on a side, away from the second region R2, within the first region R1. The second active layer 12 and the fourth active layer 14 are disposed on a side, close to the second region R2, within the first region R1.

In an exemplary embodiment, the first active layer 11 may be in an "n" shape, the second active layer 12 may be in a "7" shape, the third active layer 13 may be in a shape of a Chinese character "几", the fourth active layer 14 may be in a "1" shape, and the fifth active layer 15, the sixth active layer 16, and the seventh active layer 17 may be in an "L" shape.

In an exemplary embodiment, an active layer of each transistor may include a first region, a second region, and a channel region located between the first region and the second region. In an exemplary embodiment, a first region 11-1 of the first active layer 11 serves as a first region 17-1 of the seventh active layer 17 simultaneously; a second region 11-2 of the first active layer 11 serves as a first region 12-1 of the second active layer 12 simultaneously; a first region 13-1 of the third active layer 13 serves as a second region 14-2 of the fourth active layer 14 and a second region 15-2 of the fifth active layer 15 simultaneously; a second region 13-2 of the third active layer 13 serves as a second region 12-2 of the second active layer 12 and a first region 16-1 of the sixth active layer 16 simultaneously; a second region 16-2 of the sixth active layer 16 serves as a second region 17-2 of the seventh active layer 17 simultaneously. In an exemplary embodiment, a first region 14-1 of the fourth active layer 14 and a first region 15-1 of the fifth active layer 15 are disposed separately.

In an exemplary embodiment, the third active layer 13 of the third transistor includes a first region 13-1, a second region 13-2, and a channel region. The channel region of the third active layer 13 is disposed between the first region 13-1 and the second region 13-2, and two ends of the channel region are respectively connected with the first region 13-1 and the second region 13-2. The first region 13-1 of the third active layer 13 serves as a second region 14-2 of the fourth active layer 14 and a second region 15-2 of the fifth active layer 15 simultaneously, that is, the first region 13-1 of the third active layer 13, the second region 14-2 of the fourth active layer 14, and the second region 15-2 of the fifth active layer 15 are connected with one another. The second region 13-2 of the third active layer 13 serves as the second region 12-2 of the second active layer 12 and the first region 16-1 of the sixth active layer 16 simultaneously, that is, the second region 13-2 of the third active layer 13, the second region 12-2 of the second active layer 12, and the first region 16-1 of the sixth active layer 16 are connected with one another.

Figure 8A:
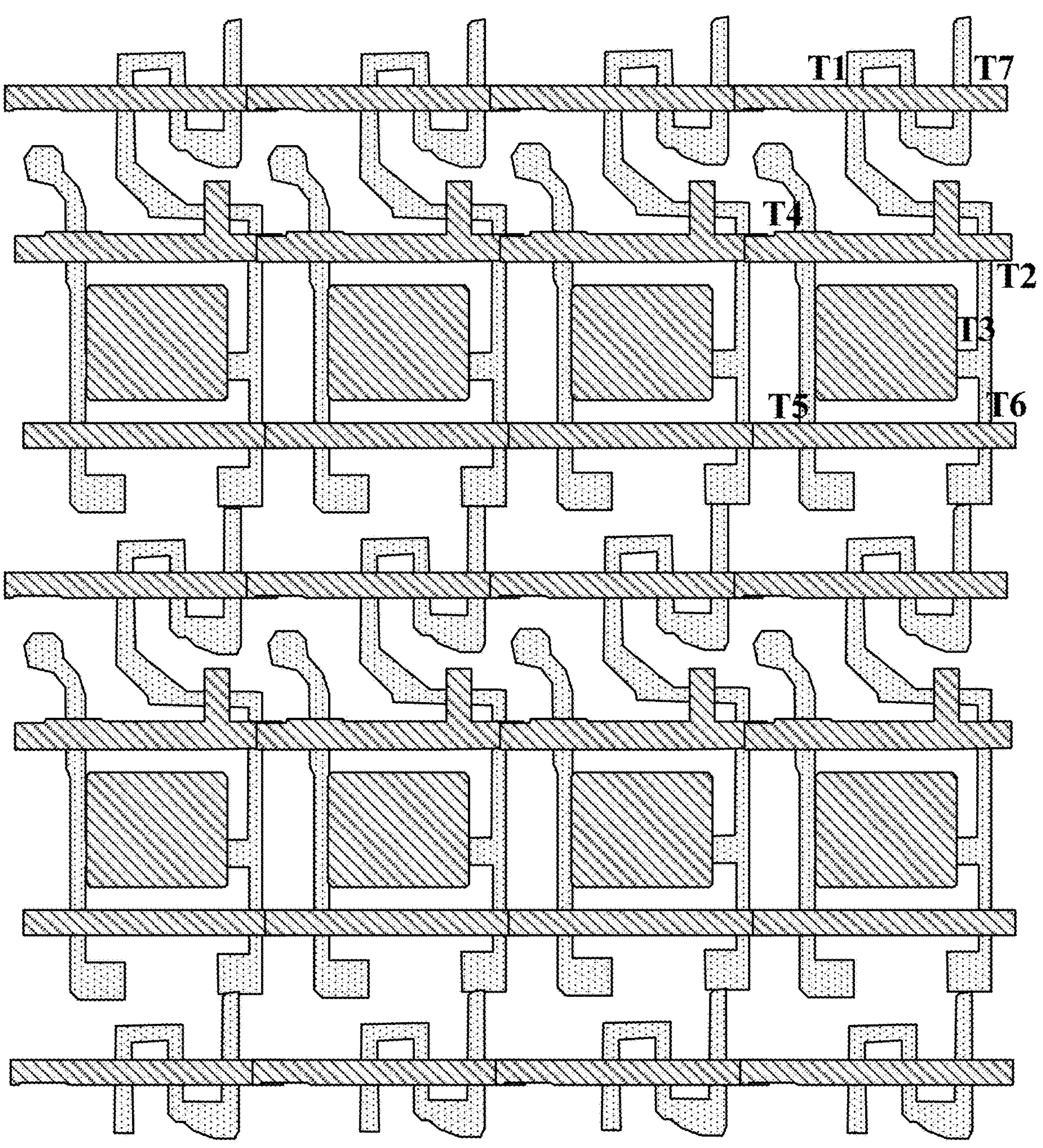
FIG. 8*a* is a schematic diagram of a structure of the display substrate shown in FIG. 5 after a first conductive layer is formed.
Figure 8B:
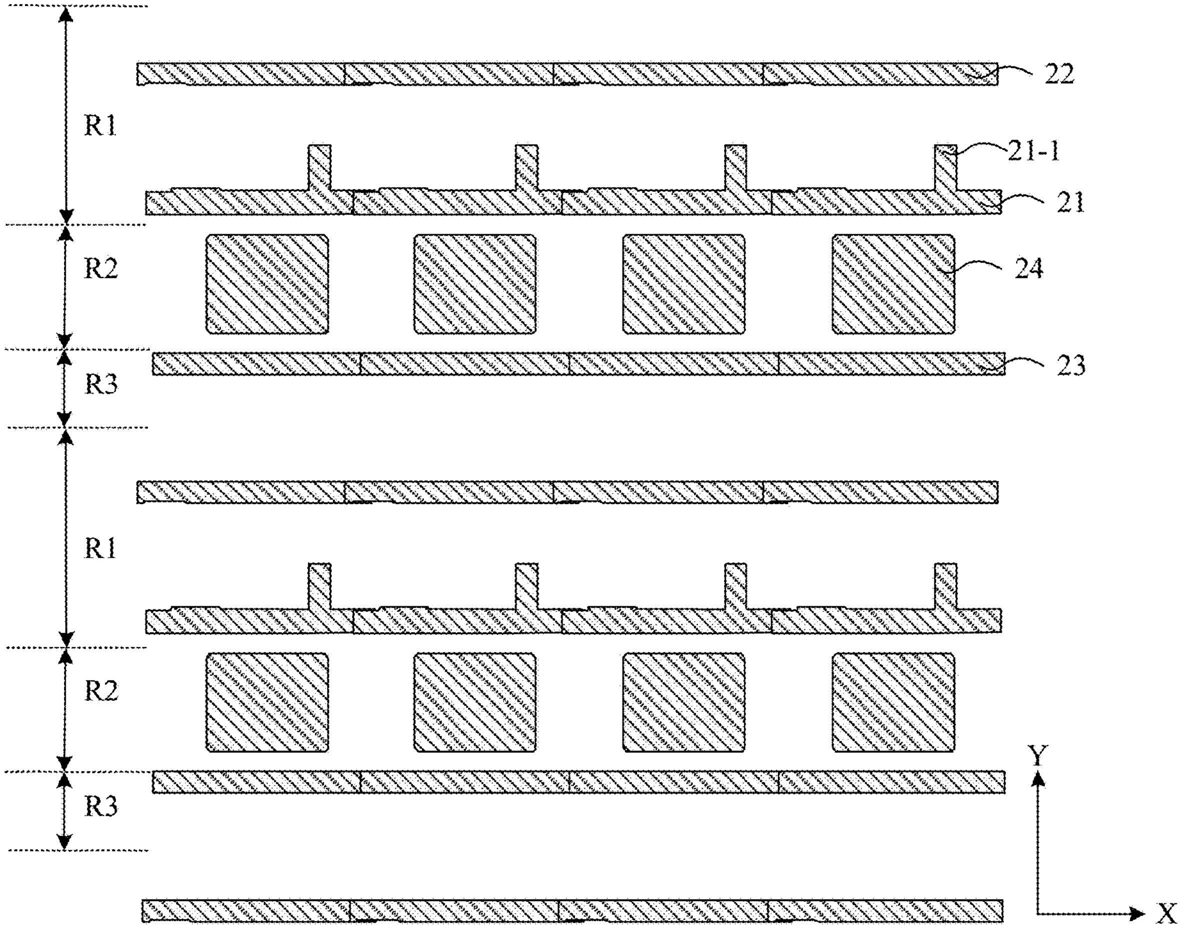
FIG. 8*b* is a schematic diagram of a structure of the first conductive layer in the display substrate shown in FIG. 5.

(2) A pattern of a first conductive layer is formed. In an exemplary embodiment, forming a pattern of a first conductive layer may include: sequentially depositing a second insulation thin film and a first metal thin film on the base substrate on which the aforementioned pattern is formed, and patterning the first metal thin film through a patterning process to form a second insulation layer that covers the pattern of the semiconductor layer and form a pattern of a first conductive layer disposed on the second insulation layer 92; wherein the pattern of the first conductive layer at least includes a first scan signal line 21, a second scan signal line 22, a light emitting control line 23, and a first electrode plate 24 of a storage capacitor, as shown in FIG. 8*a* and FIG. 8*b*, and FIG. 8*b* is a schematic plan view of the first conductive layer in FIG. 8*a*. In an exemplary embodiment, the first conductive layer may be referred to as a first gate metal (GATE1) layer.

In an exemplary embodiment, the first scan signal line 21, the second scan signal line 22, and the light emitting control line 23 extend along a first direction X. The first scan signal line 21 and the second scan signal line 22 are disposed within the first region R1. The second scan signal line 22 is located on a side of the first scan signal line 21 away from the second region R2. The light emitting control line 23 is disposed within the third region R3. The first electrode plate 24 of the storage capacitor is disposed within the second region R2 and located between the first scan signal line 21 and the light emitting control line 23.

In an exemplary embodiment, the first electrode plate 24 may be in a shape of a rectangle, and corners of the rectangle may be provided with chamfers. There is an overlapping region between an orthographic projection of the first electrode plate 24 on the base substrate 10 and an orthographic projection of the third active layer of the third transistor T3 on the base substrate 10. In an exemplary embodiment, the first electrode plate 24 serves as a gate electrode of the third transistor T3 simultaneously.

In an exemplary embodiment, an overlapping region between the first scan signal line 21 and the fourth active layer of the fourth transistor T4 serves as a gate electrode of the fourth transistor T4. The first scan signal line 21 is provided with a gate block 21-1 protruding towards the second scan signal line 22. There is an overlapping region between an orthographic projection of the gate block 21-1 on the base substrate 10 and an orthographic projection of the second active layer of the second transistor T2 on the base substrate 10. An overlapping region between the gate block 21-1 of the first scan signal line 21 and the second active layer of the second transistor T2 serves as a gate electrode of a double-gate structure of the second transistor T2. An overlapping region between the second scan signal line 22 and the first active layer of the first transistor T1 serves as a gate electrode of a double-gate structure of the first transistor T1; an overlapping region between the second scan signal line 22 and the seventh active layer of the seventh transistor T7 serves as a gate electrode of the seventh transistor T7; an overlapping region between the light emission control line 23 and the fifth active layer of the fifth transistor T5 serves as a gate electrode of the fifth transistor T5; and an overlapping region between the light emission control line 23 and the sixth active layer of the sixth transistor T6 serves as a gate electrode of the sixth transistor T6.

In an exemplary embodiment, after the pattern of the first conductive layer is formed, the semiconductor layer may be subjected to a conductive treatment by using the first conductive layer as a shield. The semiconductor layer in a region, which is shielded by the first conductive layer, forms channel regions of the first transistor T1 to the seventh transistor T7, and the semiconductor layer in a region, which is not shielded by the first conductive layer, is made to be conductive, that is, first regions and second regions of the first active layer to the seventh active layer are all made to be conductive.

After this process, the display substrate includes the first insulation layer 91 disposed on the base substrate 10, the semiconductor layer disposed on the first insulation layer 91, the second insulation layer 92 that covers the semiconductor layer, and the first conductive layer disposed on the second insulation layer 92. The semiconductor layer may include the first active layer 11 to the third active layer 17, and the first conductive layer may include the first scan signal line 21, the second scan signal line 22, the light emitting control line 23, and the first electrode plate 24 of the storage capacitor.

Figure 9A:
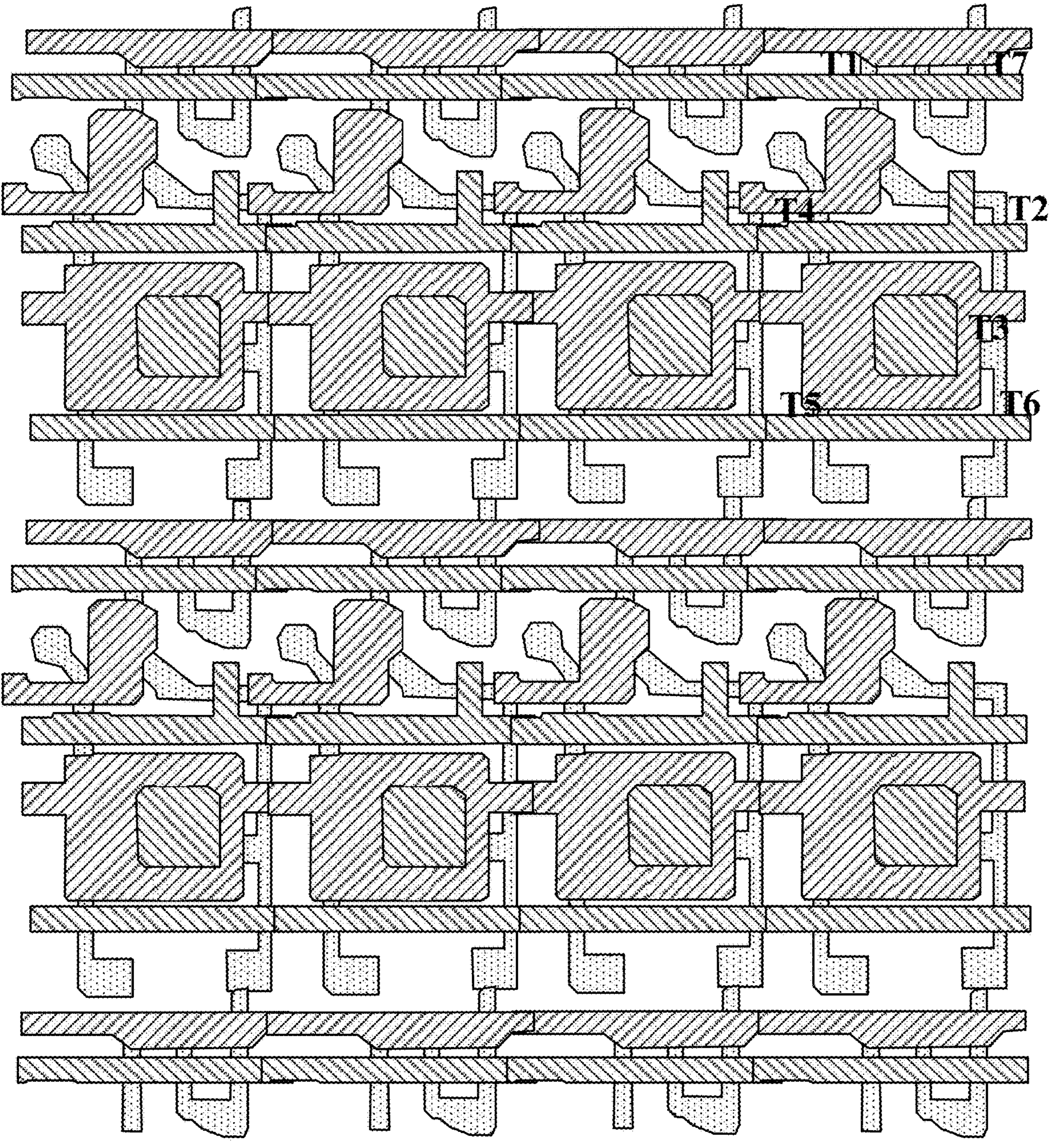
FIG. 9*a* is a schematic diagram of a structure of the display substrate shown in FIG. 5 after a second conductive layer is formed.
Figure 9B:
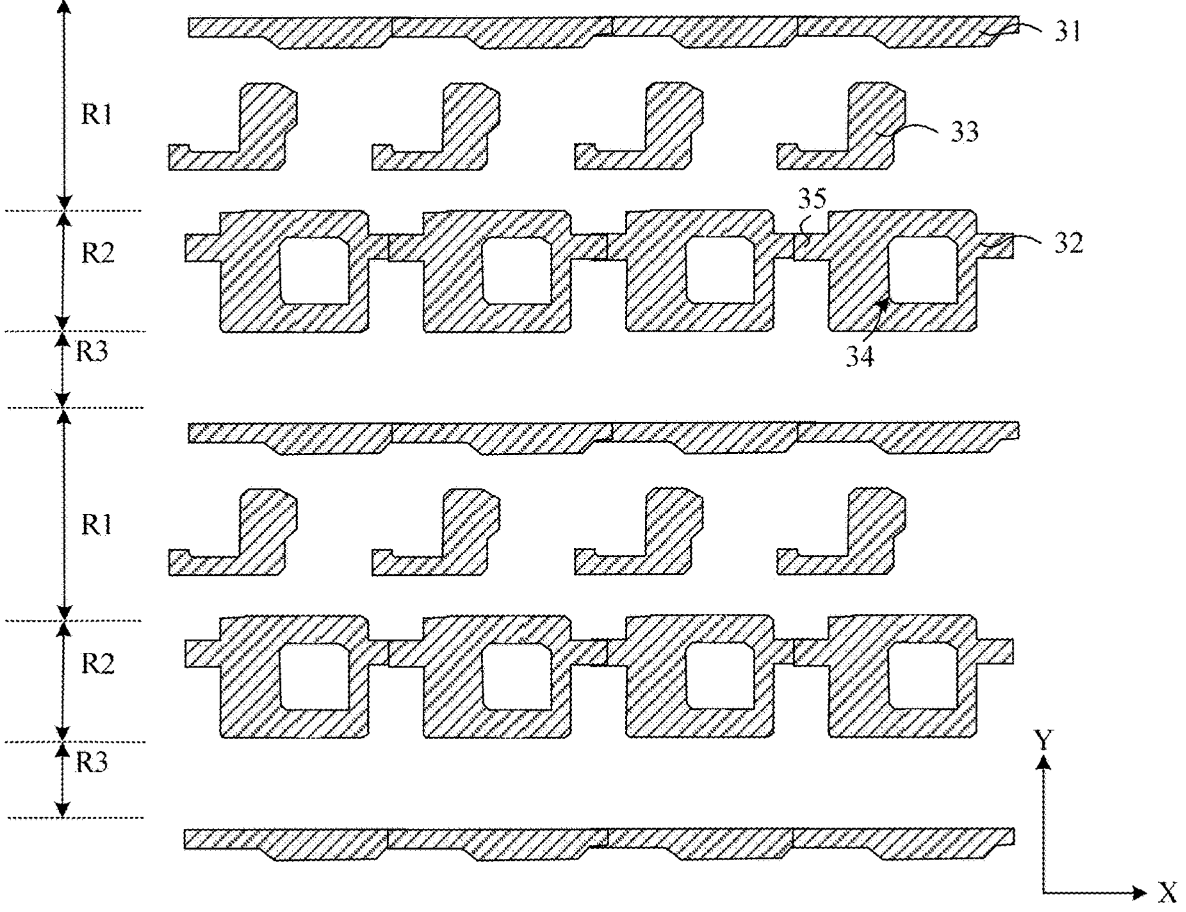
FIG. 9*b* is a schematic diagram of a structure of the second conductive layer in the display substrate shown in FIG. 5.

(3) A pattern of a second conductive layer is formed. In an exemplary embodiment, forming a pattern of a second conductive layer may include: sequentially depositing a third insulation thin film and a second metal thin film on the base substrate on which the aforementioned patterns are formed, and patterning the second metal thin film through a patterning process to form a third insulation layer 93 that covers the first conductive layer and form a pattern of a second conductive layer disposed on the third insulation layer 93. The pattern of the second conductive layer at least includes: an initial signal line 31, a second electrode plate 32 of the storage capacitor, a shield electrode 33, and an electrode plate connection line 35, as shown in FIG. 9*a* and FIG. 9*b*, and FIG. 9*b* is a schematic plan view of the second conductive layer in FIG. 9*a*. In an exemplary embodiment, the second conductive layer may be referred to as a second gate metal (GATE2) layer.

In an exemplary embodiment, the initial signal line 31 extends along the first direction X, is disposed within the first region R1, and is located on a side of the second scan signal line 22 away from the second region R2. The second electrode plate 32 of the storage capacitor is disposed within the second region R2 and is located between the first scan signal line 21 and the light emitting control line 23. The shield electrode 33 is disposed within the first region R1. The shield electrode 33 is configured to shield an influence of data voltage jump on a key node, avoid data voltage jump from affecting a potential of a key node of a pixel drive circuit adversely, and improve a display effect.

In an exemplary embodiment, the initial signal line 31 may be set with an unequal width, and a width of the initial signal line 31 is a dimension of the initial signal line 31 in the second direction Y. The initial signal line 31 includes a region overlapped with the semiconductor layer and a region not overlapped with the semiconductor layer. A width of the initial signal line 31 in the region not overlapped with the semiconductor layer may be smaller than a width of the initial signal line 31 in the region overlapped with the semiconductor layer.

In an exemplary embodiment, a contour of the second electrode plate 32 may be a shape of a rectangle, and corners of the rectangle may be provided with chamfers. There is an overlapping region between an orthographic projection of the second electrode plate 32 on the base substrate 10 and an orthographic projection of the first electrode plate 24 on the base substrate 10. The second electrode plate 32 is provided with an opening 34 and the opening 34 may be located in a middle of the second region R2. The opening 34 may be in a shape of a rectangle so that the second electrode plate 32 forms an annular structure. The opening 34 exposes the third insulation layer 93 covering the first electrode plate 24 and the orthographic projection of the first electrode plate 24 on the base substrate 10 contains an orthographic projection of the opening 34 on the base substrate 10. In an exemplary embodiment, the opening 34 is configured to accommodate a first via subsequently formed, the first via is located within the opening 34 and exposes the first electrode plate 24, so that a second electrode of the first transistor T1 subsequently formed is connected with the first electrode plate 24.

In an exemplary embodiment, the electrode plate connection line 35 is disposed between second electrode plates 32 of adjacent sub-pixels along the first direction X, a first end of the electrode plate connection line 35 is connected with a second electrode plate 32 of a present sub-pixel, and a second end of the electrode plate connection line 35 extends along the first direction X or an opposite direction of the first direction X, and is connected with a second electrode plate 32 of an adjacent sub-pixel, that is, the electrode plate connection line 35 is configured to make second electrode plates of adjacent sub-pixels in the first direction X be connected with each other. In an exemplary embodiment, second electrode plates in a sub-pixel row form an integral structure connected with each other through the electrode plate connection line 35, and the second electrode plates with the integral structure may be reused as a power signal line, thus ensuring that multiple second electrode plates in the sub-pixel row have a same potential, which is beneficial to improving uniformity of a panel, avoiding poor display of the display substrate, and ensuring a display effect of the display substrate.

In an exemplary embodiment, an orthographic projection of an edge of the second electrode plate 32 adjacent to the first region R1 on the base substrate 10 is overlapped with an orthographic projection of a boundary line of the first region R1 and the second region R2 on the base substrate 10; an orthographic projection of an edge of the second electrode plate 32 adjacent to the third region R3 on the base substrate 10 is overlapped with an orthographic projection of a boundary line of the second region R2 and the third region R3 on the base substrate 10, that is, a length of the second electrode plate 32 is equal to a length of the second region R2, and the length of the second electrode plate 32 refers to a dimension of the second electrode plate 32 in the second direction Y.

After this process, the display substrate includes the first insulation layer 91 disposed on the base substrate 10, the semiconductor layer disposed on the first insulation layer 91, the second insulation layer 92 covering the semiconductor layer, the first conductive layer disposed on the second insulation layer 92, the third insulation layer 93 covering the first conductive layer, and the second conductive layer disposed on the third insulation layer 93. The semiconductor layer may include the first active layer 11 to the seventh active layer 17. The first conductive layer may include the first scan signal line 21, the second scan signal line 22, the light emitting line 23, and the first electrode plate 24 of the storage capacitor. The second conductive layer may include the initial signal line 31, the second electrode plate 32 of the storage capacitor, the shield electrode 33, and the electrode plate connection line 35.

Figure 10A:
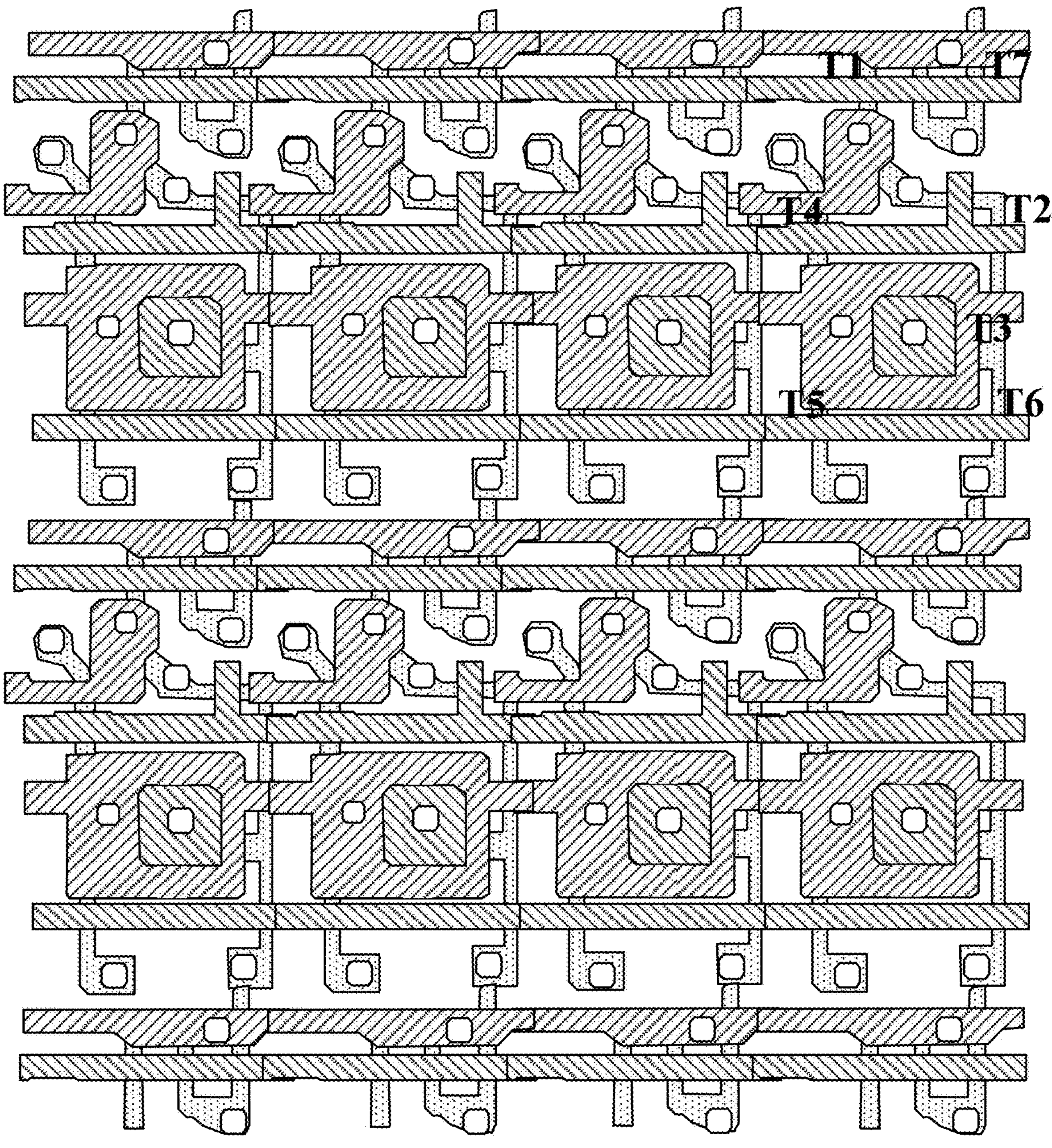
FIG. 10*a* is a schematic diagram of a structure of the display substrate shown in FIG. 5 after a fourth insulation layer is formed.
Figure 10B:
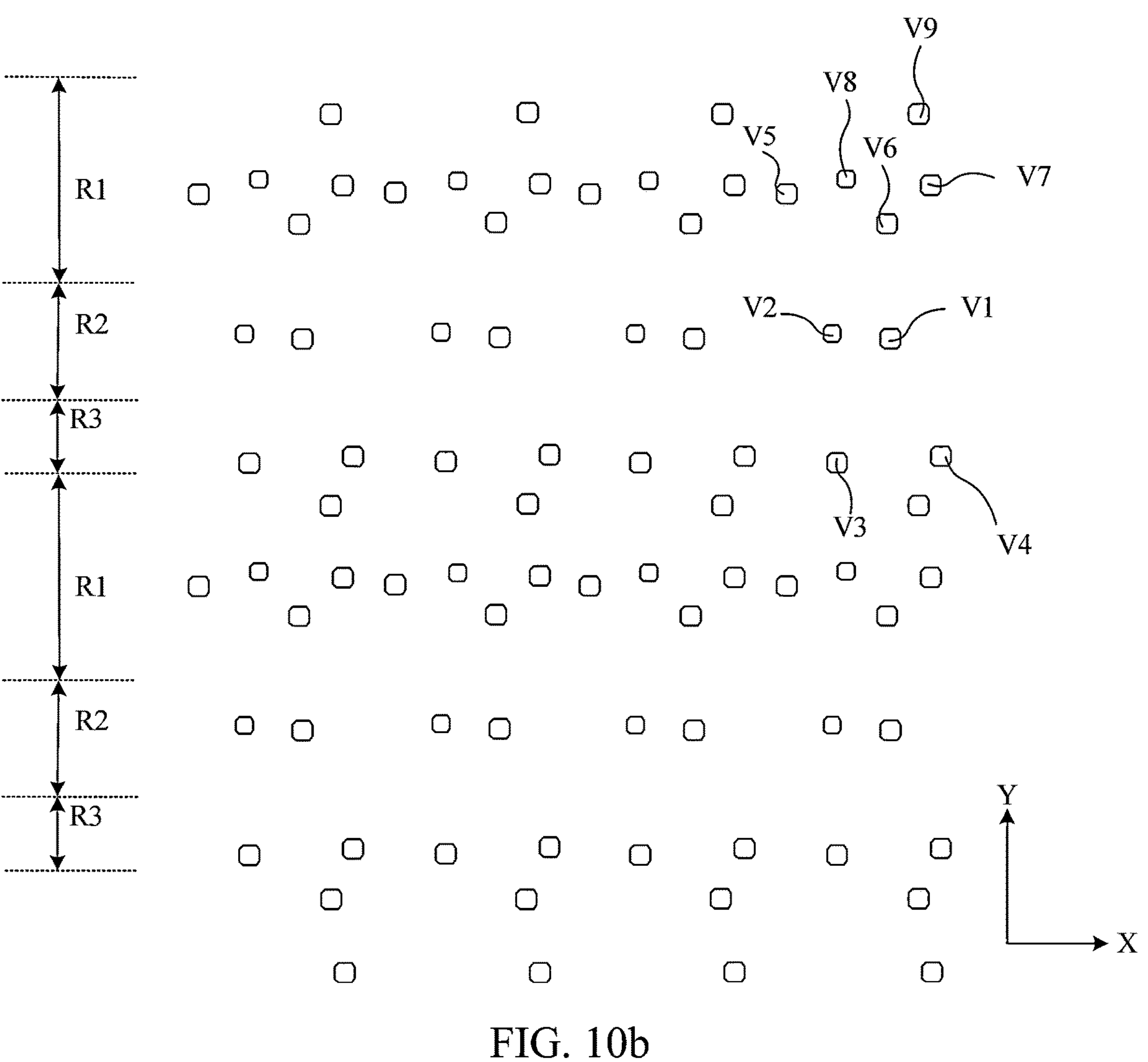
FIG. 10*b* is a schematic diagram of a structure of the fourth insulation layer in the display substrate shown in FIG. 5.

(4) A pattern of a fourth insulation layer 94 is formed. In an exemplary embodiment, forming a pattern of a fourth insulation layer may include: a fourth insulation thin film is deposited on the base substrate on which the aforementioned patterns are formed, and the fourth insulation thin film is patterned through a patterning process to form a fourth insulation layer 94 that covers the second conductive layer, wherein the fourth insulation layer 94 is provided with multiple vias, the multiple vias at least include a first via V1, a second via V2, a third via V3, a fourth via V4, a fifth via V5, a sixth via V6, a seventh via V7, an eighth via V8, and a ninth via V9, as shown in FIG. 10*a* and FIG. 10*b*. FIG. 10*b* is a schematic plan view of the fourth insulation layer in FIG. 10*a*.

In an exemplary embodiment, the first via V1 is located within the opening 34 of the second electrode plate 32, and an orthographic projection of the first via V1 on the base substrate 10 is located within a range of the orthographic projection of the opening 34 on the base substrate. The fourth insulation layer and the third insulation layer within the first via V1 are etched off to expose a surface of the first electrode plate 24. The first via V1 is configured such that the second electrode of the first transistor T1 subsequently formed is connected with the first electrode plate 24 through the via.

In an exemplary embodiment, the second via V2 is located in a region where the second electrode plate 32 is located, and an orthographic projection of the second via V2 on the base substrate is within a range of the orthographic projection of the second electrode plate 32 on the base substrate. The fourth insulation layer within the second via V2 is etched off to expose a surface of the second electrode plate 32. The second via V2 is configured such that a first power line that is subsequently formed is connected with the second electrode plate 32 through the via. In an exemplary embodiment, multiple second via V2 serving as power vias may be included, and the multiple second vias V2 may be sequentially arranged along the second direction Y, thereby increasing connection reliability between the first power line and the second electrode plate 32.

In an exemplary embodiment, the third via V3 is located in the third region R3, and the fourth insulation layer, the third insulation layer, and the second insulation layer within the third via V3 are etched off to expose a surface of the first region of the fifth active layer. The third via V3 is configured such that the first power line that is subsequently formed is connected with the fifth active layer through the via.

In an exemplary embodiment, the fourth via V4 is located in the third region R3, and the fourth insulation layer, the third insulation layer, and the second insulation layer within the fourth via V4 are etched off to expose a surface of the second region of the sixth active layer (i.e., the second region of the seventh active layer). The fourth via V4 is configured such that a second electrode of the sixth transistor T6 subsequently formed is connected with the sixth active layer through the via and a second electrode of the seventh transistor T7 subsequently formed is connected with the seventh active layer through the via.

In an exemplary embodiment, the fifth via V5 is located in the first region R1, the fourth insulation layer, the third insulation layer, and the second insulation layer within the fifth via V5 are etched off to expose a surface of the first region of the fourth active layer. The fifth via V5 is configured such that a data signal line that is subsequently formed is connected with the fourth active layer through the via. The fifth via V5 is referred to as a data writing hole.

In an exemplary embodiment, the sixth via V6 is located in the first region R1, and the fourth insulation layer, the third insulation layer, and the second insulation layer within the sixth via V6 are etched off to expose a surface of the second region of the first active layer (i.e., the first region of the second active layer). The sixth via V6 is configured such that a second electrode of the first transistor T1 that is subsequently formed is connected with the first active layer through the via, and a first electrode of the second transistor T2 that is subsequently formed is connected with the second active layer through the via.

In an exemplary embodiment, the seventh via V7 is located in the first region R1, and the fourth insulation layer, the third insulation layer, and the second insulation layer within the seventh via V7 are etched off to expose a surface of the first region of the seventh active layer (i.e., the first region of the first active layer). The seventh via V7 is configured such that a first electrode of the seventh transistor T7 subsequently formed is connected with the seventh active layer through the via and a first electrode of the first transistor T1 subsequently formed is connected with the first active layer through the via.

In an exemplary embodiment, the eighth via V8 is located in the first region R1, and the fourth insulation layer within the eighth via V8 is etched off to expose a surface of the shield electrode 33. The eighth via V8 is configured such that the first power line that is subsequently formed is connected with the shield electrode 33 through the via.

In an exemplary embodiment, the ninth via V9 is located in the first region R1, and the fourth insulation layer within the ninth via V9 is etched off to expose a surface of the initial signal line 31. The ninth via V9 is configured such that the first electrode of the seventh transistor T7 (i.e., the first electrode of the first transistor T1) formed subsequently is connected with the initial signal line 31 through the via.

Figure 11A:
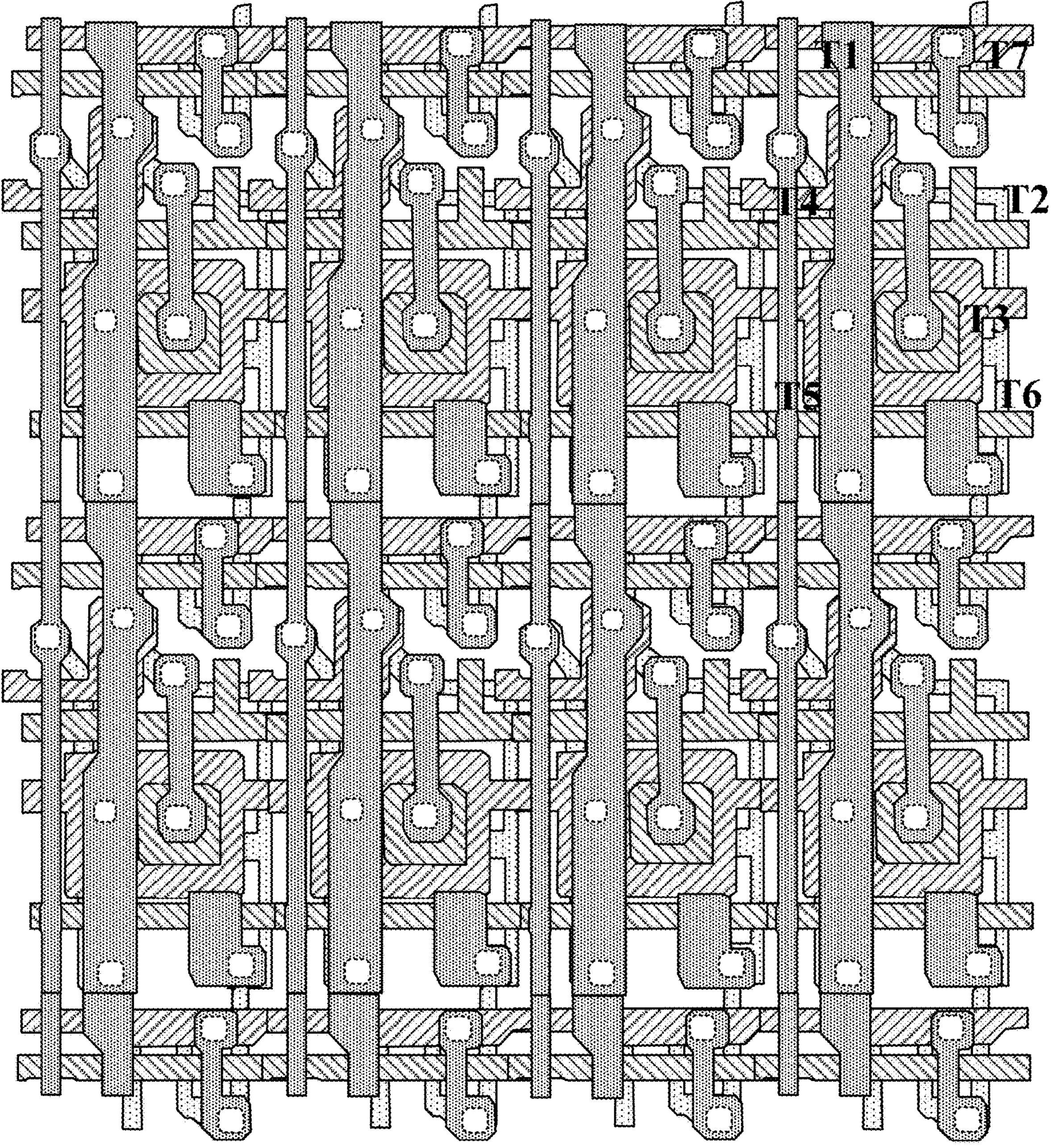
FIG. 11*a* is a schematic diagram of a structure of the display substrate shown in FIG. 5 after a third conductive layer is formed.
Figure 11B:
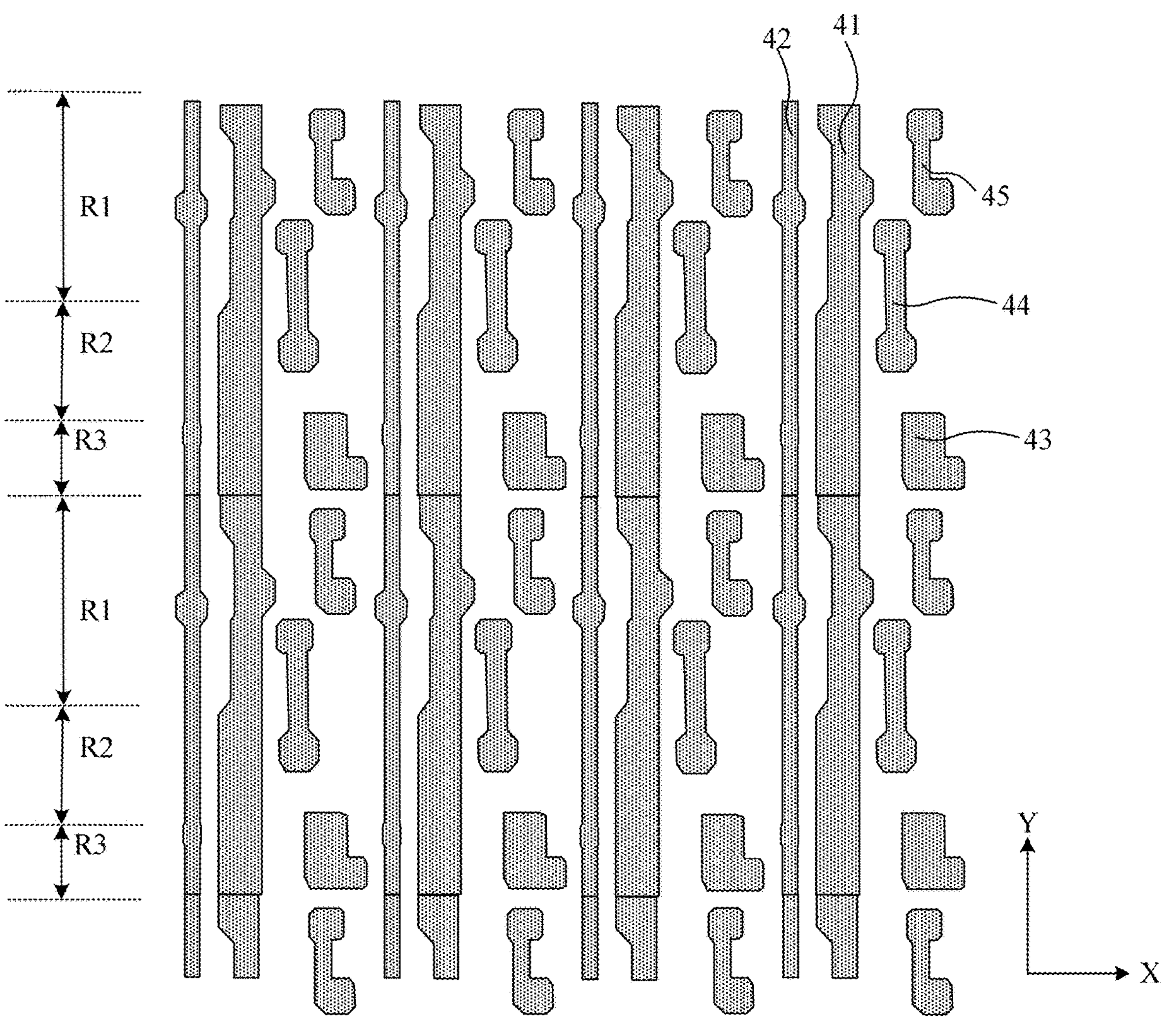
FIG. 11*b* is a schematic diagram of a structure of the third conductive layer in the display substrate shown in FIG. 5.

(5) A pattern of a third conductive layer is formed. In an exemplary embodiment, forming a third conductive layer may include: depositing a third metal thin film on the base substrate on which the aforementioned patterns are formed, and patterning the third metal thin film through a patterning process to form a third conductive layer disposed on the fourth insulation layer 94. The third conductive layer at least includes: a first branch 41 of a first power line, a data signal line 42, a first connection electrode 43, a second connection electrode 44, and a third connection electrode 45, as shown in FIG. 11*a* and FIG. 11*b*, and FIG. 11*b* is a schematic plan view of the third conductive layer in FIG. 11*a*. In an exemplary embodiment, the third conductive layer may be referred to as a first source-drain metal (SD1) layer.

In an exemplary embodiment, the first branch 41 of the first power line extends along the second direction Y. The first branch 41 of the first power line, on one aspect, is connected with the second electrode plate 32 through the second via V2, and on another aspect, is connected with the shield electrode 33 through the eighth via V8, and on yet another aspect, is connected with the fifth active layer through the third via V3, so that the shield electrode 32 and the second electrode plate 32 have a same potential as the first branch 41 of the first power line. Since there is an overlapping region between an orthographic projection of the shield electrode 33 on the base substrate 10 and an orthographic projection of a data signal line that is subsequently formed on the base substrate 10, and the shield electrode 33 is connected with the first branch 41 of the first power line, an influence of data voltage jump on a key node is effectively shielded, thus avoiding an influence of data voltage jump on a potential of a key node of a pixel drive circuit, and improving a display effect.

In an exemplary embodiment, the data signal line 42 extends along the second direction Y, and the data signal line 42 is connected with the first region of the fourth active layer through the fifth via V5, so that a data signal transmitted by the data signal line 42 is written into the fourth transistor T4.

In an exemplary embodiment, the first connection electrode 43 is connected with the second region of the sixth active layer (which is also the second region of the seventh active layer) through the fourth via V4, so that the second electrode of the sixth transistor T6 and the second electrode of the seventh transistor T7 have a same potential. In an exemplary embodiment, the first connection electrode 43 may be used as the second electrode of the sixth transistor T6 and the second electrode of the seventh transistor T7. In an exemplary embodiment, the first connection electrode 43 is configured to be connected with an anode connection electrode (a first anode connection electrode 53 and a second anode connection electrode 54) subsequently formed.

In an exemplary embodiment, the second connection electrode 44 extends along the second direction Y. A first terminal of the second connection electrode 44 is connected with the second region of the first active layer (which is also the first region of the second active layer) through the sixth via V6, and a second terminal of the second connection electrode 44 is connected with the first electrode plate 24 through the first via V1, so that the first electrode plate 24, the second electrode of the first transistor T1, and the first electrode of the second transistor T2 have a same potential. In an exemplary embodiment, the second connection electrode 44 may serve as the second electrode of the first transistor T1 and the first electrode of the second transistor T2.

In an exemplary embodiment, the third connection electrode 45 extends along the second direction Y, and has a first terminal connected with the initial signal line 31 through the ninth via V9, and a second terminal is connected with the first region of the seventh active layer (i.e., the first region of the first active layer) through the seventh via V7, so that the first electrode of the seventh transistor T7 and the first electrode of the first transistor T1 have a same potential as the initial signal line 31. In an exemplary embodiment, the third connection electrode 45 may be serve as the first electrode of the seventh transistor T7 and the first electrode of the first transistor T1.

In an exemplary embodiment, the first branch 41 of the first power line 41 and the data signal line 42 may be straight lines with equal widths, or straight lines with unequal widths.

Figure 12A:
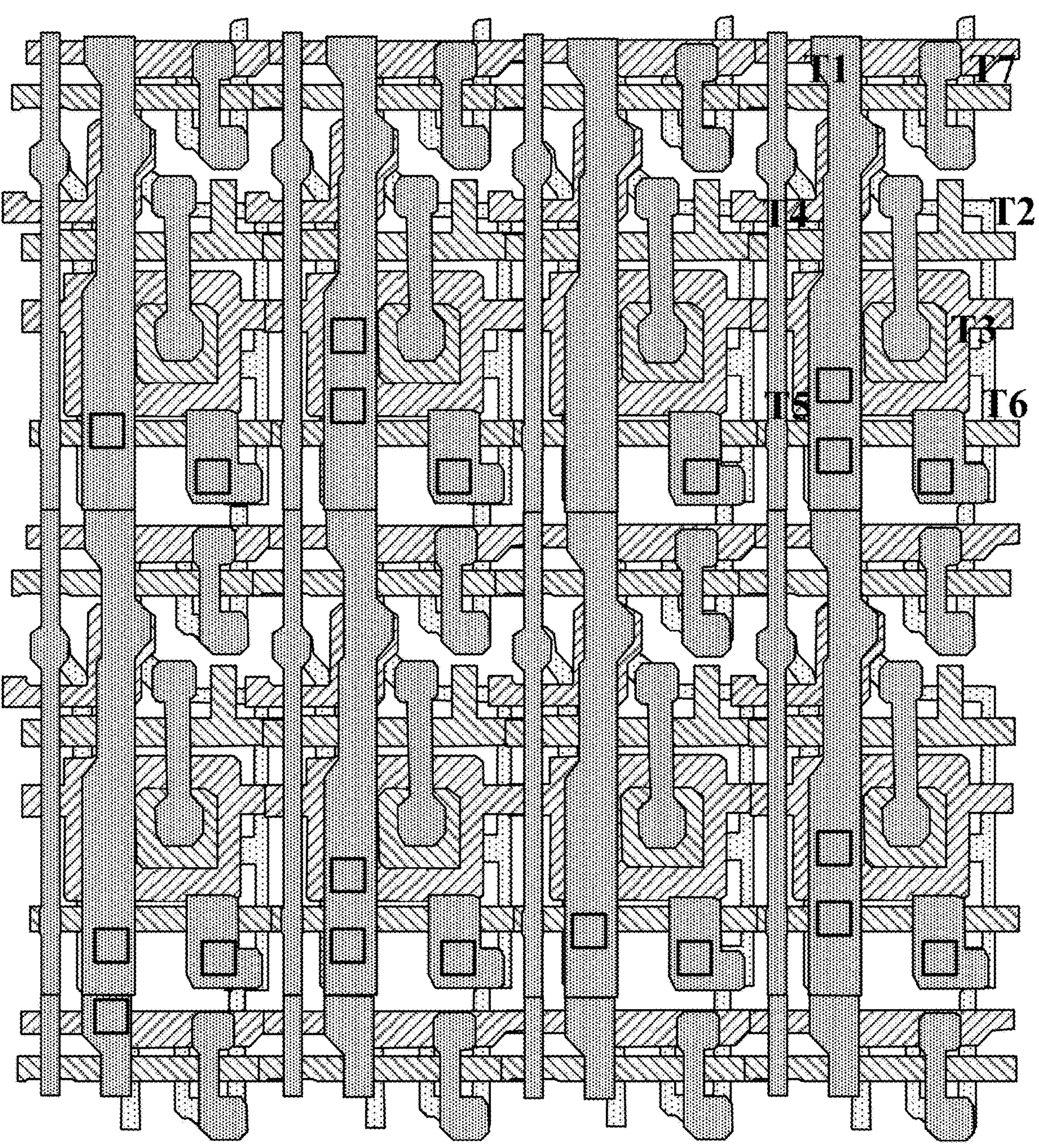
FIG. 12*a* is a schematic diagram of a structure of the display substrate shown in FIG. 5 after a first planarization layer is formed.
Figure 12B:
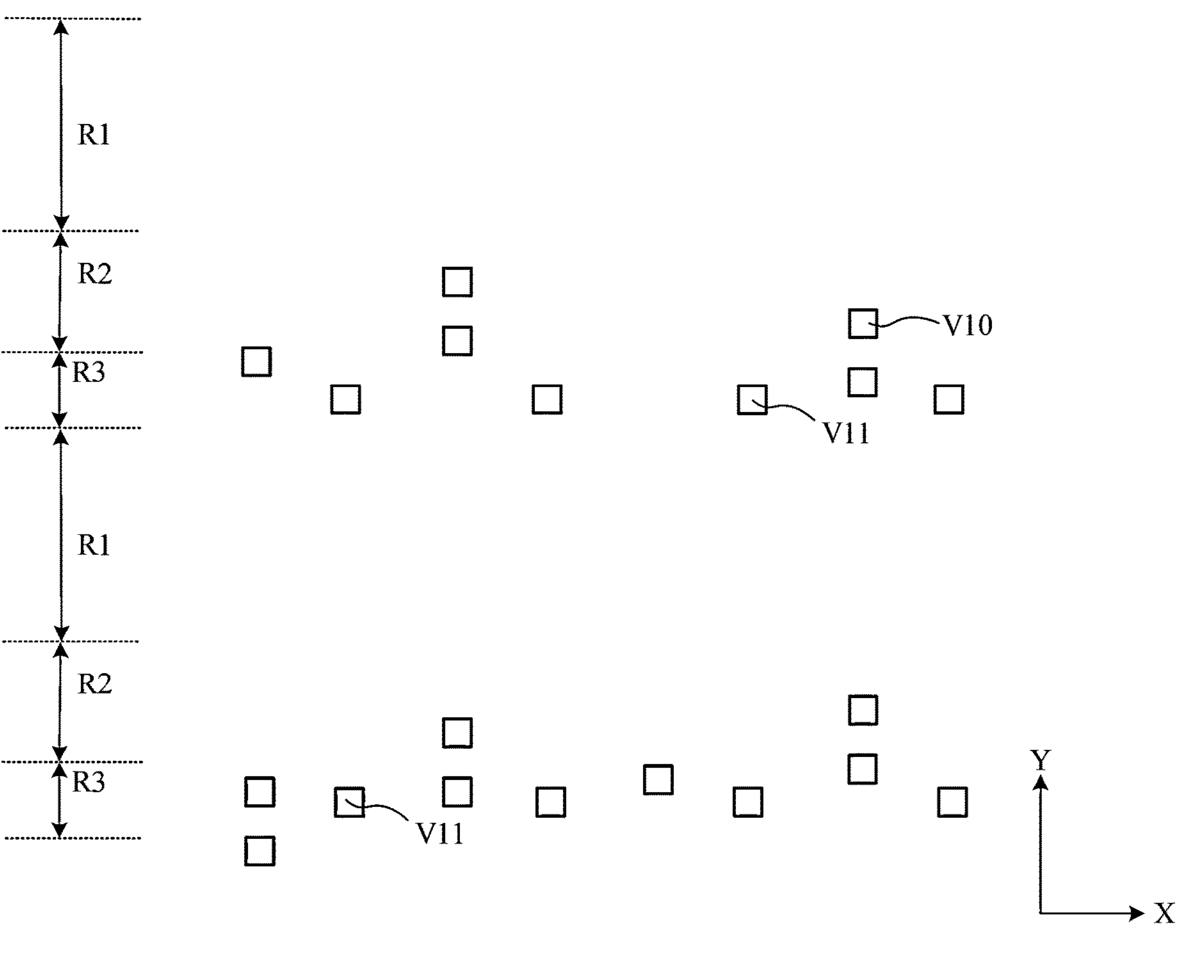
FIG. 12*b* is a schematic diagram of a structure of the first planarization layer in the display substrate shown in FIG. 5.

(6) A pattern of a first planarization layer 95 is formed. In an exemplary embodiment, forming a pattern of a first planarization layer 95 may include: a first planarization thin film is coated on the base substrate on which the aforementioned patterns are formed, and the first planarization thin film is patterned through a patterning process to form a first planarization layer 95 that covers the third conductive layer, wherein the first planarization layer 95 is provided with a tenth via V10 and an eleventh via V11, as shown in FIG. 12*a* and FIG. 12*b*. FIG. 12*b* is a schematic plan view of the first planarization layer in FIG. 12*a*.

The tenth via V10 is located in a region where the first branch 41 of the first power line is located, and the first planarization layer within the tenth via V10 is removed to expose a surface of the first branch 41 of the first power line. The tenth via V10 is configured such that a second branch 51 of the first power line subsequently formed is connected with the first branch 41 of the first power line through the via.

The eleventh via V11 is located in a region where the first connection electrode 43 is located, the first planarization layer within the eleventh via V11 is removed to expose a surface of the first connection electrode 43, and the eleventh via V11 is configured such that an anode connection electrode formed subsequently is connected with the first connection electrode 43 through the via.

Figure 13A:
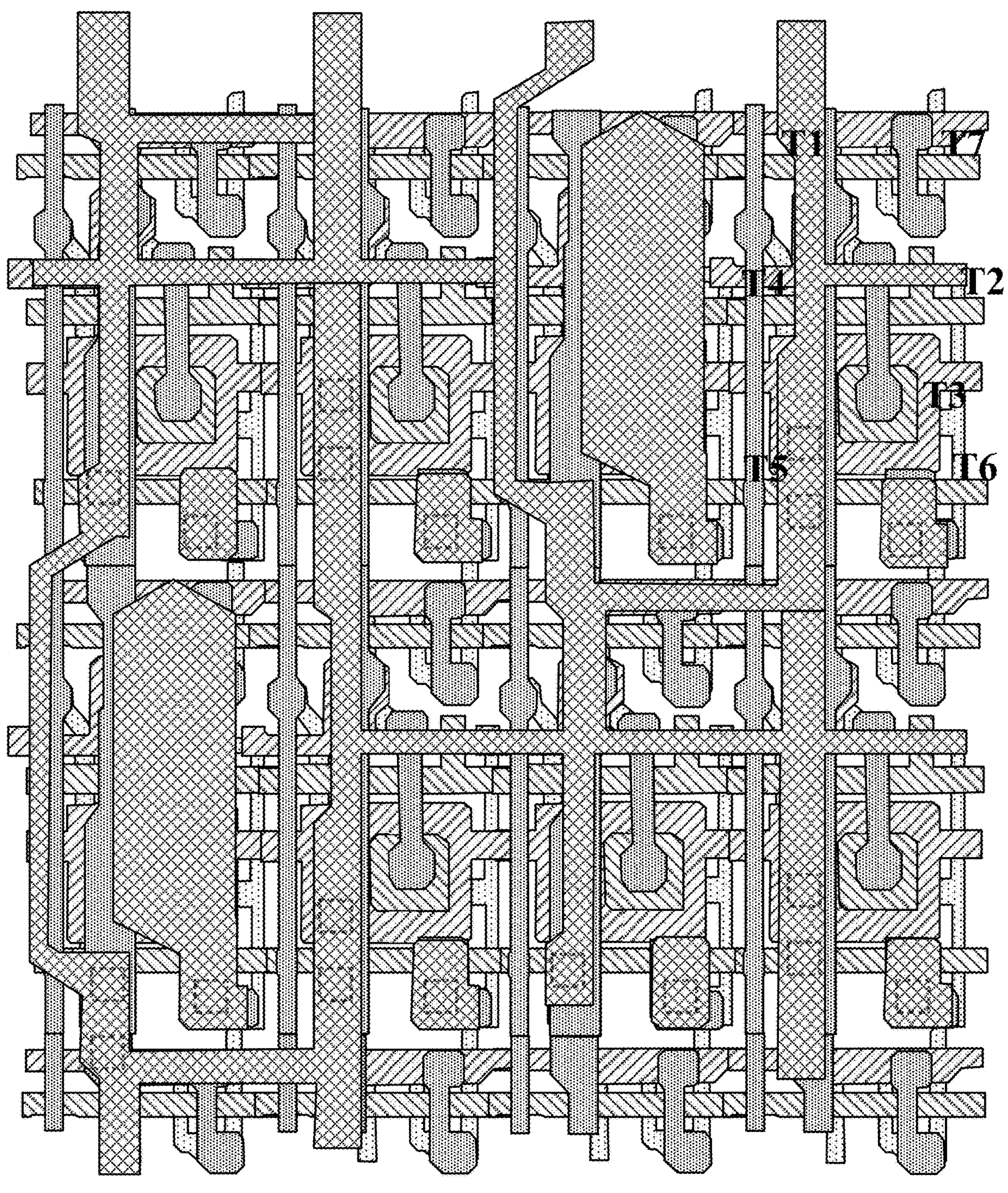
FIG. 13*a* is a schematic diagram of a structure of the display substrate shown in FIG. 5 after a fourth conductive layer is formed.
Figure 13B:
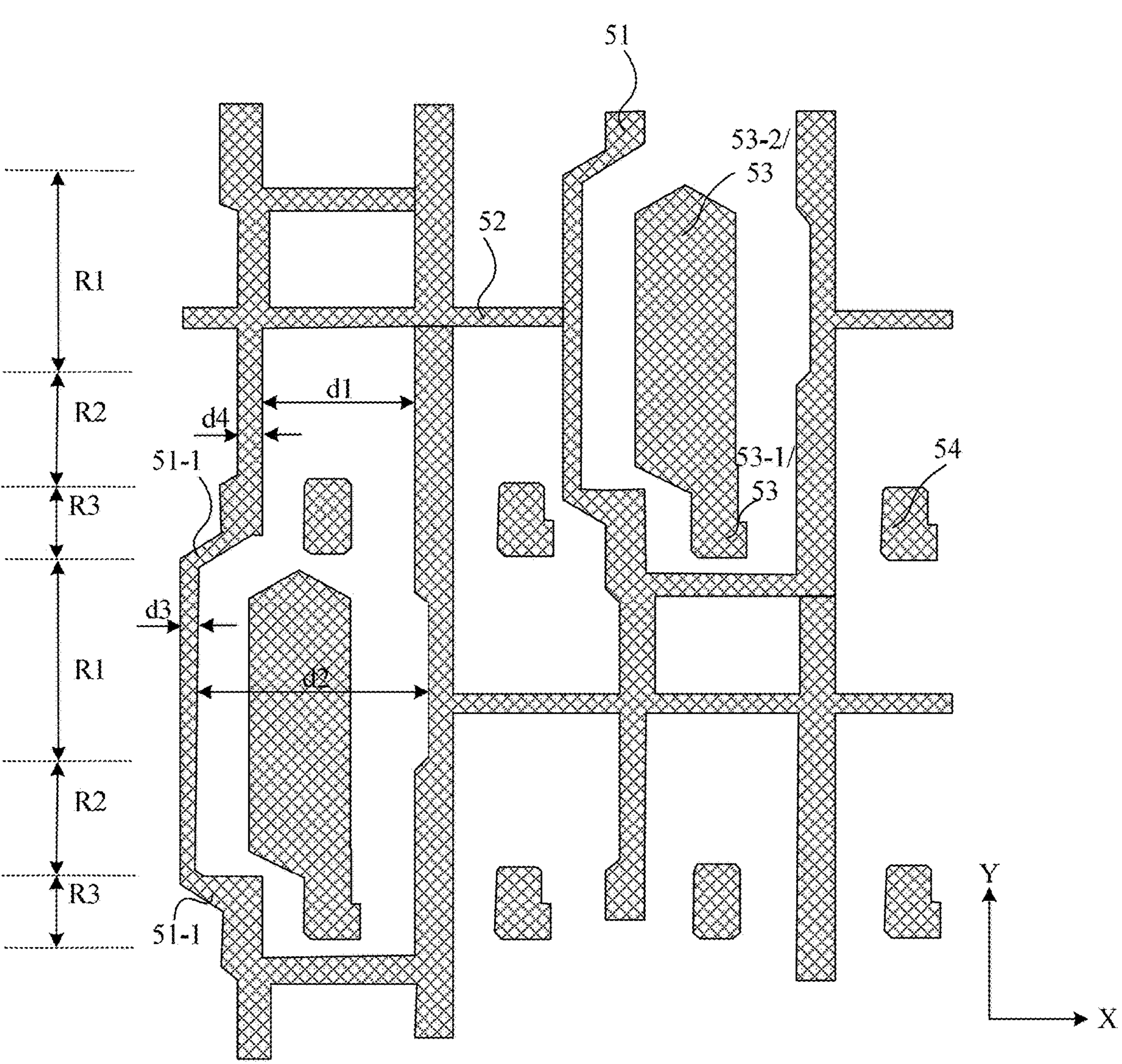
FIG. 13*b* is a schematic diagram of a structure of the fourth conductive layer in the display substrate shown in FIG. 5.

(7) A pattern of a fourth conductive layer is formed. Forming a fourth conductive layer may include: depositing a fourth metal thin film on the base substrate on which the aforementioned patterns are formed, and patterning the fourth metal thin film through a patterning process to form a fourth conductive layer disposed on the first planarization layer 95. The fourth conductive layer at least includes: the second branch 51 of the first power line, a power connection electrode 52, a first anode connection electrode 53, and a second anode connection electrode 54, as shown in FIG. 13*a* and FIG. 13*b*, and FIG. 13*b* is a schematic plan view of the fourth conductive layer in FIG. 13*a*. In an exemplary embodiment, the fourth conductive layer may be referred to as a second source-drain metal (SD2) layer.

In an exemplary embodiment, the second branch 51 of the first power line extends along the second direction Y, there is an overlapping region between an orthographic projection of the first branch 41 of the first power line on the base substrate 10 and an orthographic projection of the second branch 51 of the first power line on the base substrate 10, and the second branch 51 of the first power line is connected with the first branch 41 of the first power line through the tenth via V10.

In an exemplary embodiment, the second branch 51 of the first power line is provided with multiple bending parts 51-1, the bending parts 51-1 are configured such that a distance of second branches of two first power lines on both sides of the first anode connection electrode 53 along the first direction X in a region of the first anode connection electrode 53 is greater than a distance along the first direction X in a region other than the region of the first anode connection electrode 53.

In an exemplary embodiment, a width of the second branch 51 of the first power line in a region close to the first anode connection electrode 53 is smaller than a width in a region away from the first anode connection electrode 53.

In an exemplary embodiment, the power connection electrode 52 extends along the first direction X, and second branches 51 of adjacent first power lines are connected through one or more power connection electrodes 52.

In an exemplary embodiment, the second anode connection electrode 54 is connected with the first connection electrode 43 through the eleventh via V11.

In an exemplary embodiment, the first anode connection electrode 53 is located in a region of a first circuit unit, and the first circuit unit is electrically connected with a red light emitting device that emits red light.

In an exemplary embodiment, the second anode connection electrode 54 is located in a region of a second circuit unit and a region of a third circuit unit, the second circuit unit is electrically connected with a blue light emitting device that emits blue light, and the third circuit unit is electrically connected with a green light emitting device that emits green light.

In an exemplary embodiment, an area of an orthographic projection of the first anode connection electrode 53 on the base substrate 10 is greater than an area of an orthographic projection of the second anode connection electrode 53 on the base substrate 10.

In an exemplary embodiment, the first anode connection electrode 53 includes an electrode main body part 53-2 and an electrode protrusion part 53-1 disposed on the electrode main body part 53-2, there is an overlapping region between an orthographic projection of the electrode protrusion part 53-1 on the base substrate 10 and an orthographic projection of the first connection electrode 43 on the base substrate 10, and the electrode protrusion part 53-1 is connected with the first connection electrode 43 through the eleventh via V11.

In an exemplary embodiment, a size and a shape of the electrode main body part 53-2 may be close to or the same as a size and a shape of a first anode 61 subsequently formed, and a size and a shape of the electrode protrusion part 53-1 may be close to or the same as a size and a shape of the second anode connection electrode 54. During actual use, sizes and shapes of the first anode connection electrode 53 and the second anode connection electrode 54 may be determined according to an actual situation, and the present disclosure is not limited thereto.

In an exemplary embodiment, there is an overlapping region between an orthographic projection of the second anode connection electrode on the base substrate 10 and an orthographic projection of the first connection electrode 43 on the base substrate 10, and the second anode connection electrode is connected with the first connection electrode 43 through the eleventh via V11.

In an exemplary embodiment, the second branch 51 of the first power line may be a straight line with an equal width or a straight line with unequal widths.

Figure 14A:
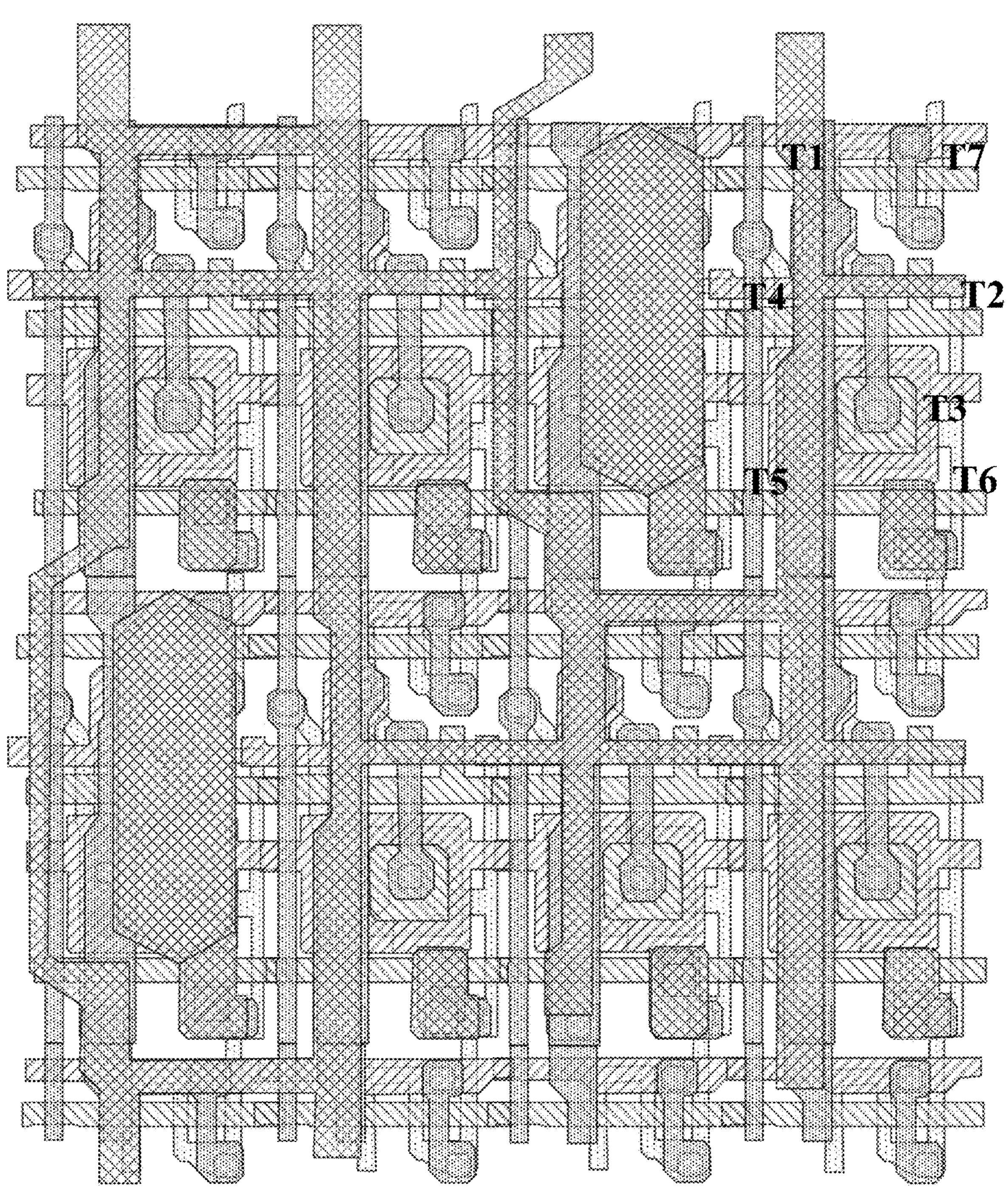
FIG. 14*a* is a schematic diagram of a structure of the display substrate shown in FIG. 5 after a second planarization layer is formed.
Figure 14B:
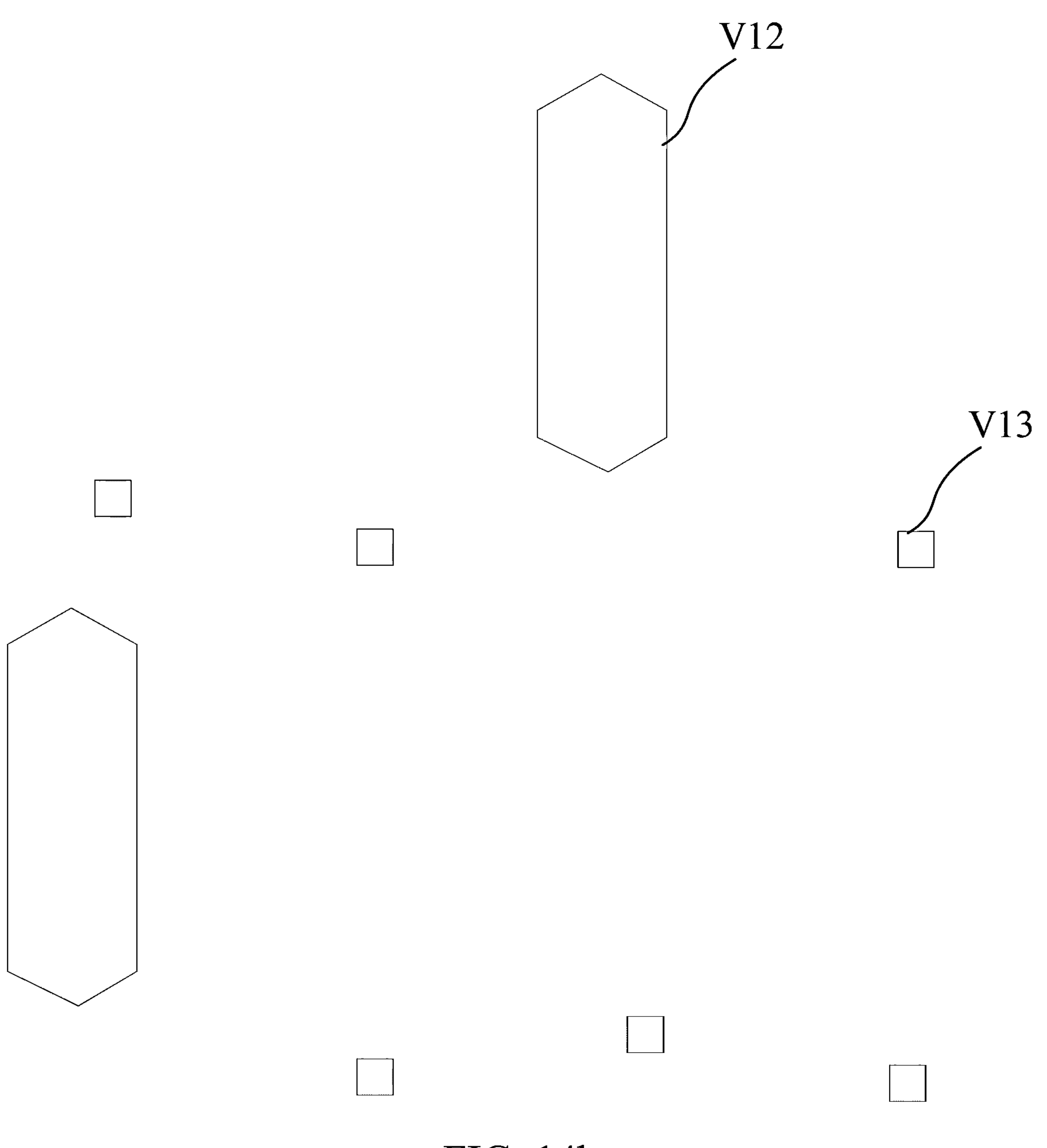
FIG. 14*b* is a schematic diagram of a structure of the second planarization layer in the display substrate shown in FIG. 5.

(8) A pattern of a second planarization layer 96 is formed. In some exemplary implementation modes, forming a pattern of a second planarization layer 96 may include: a second planarization thin film is coated on the base substrate on which the aforementioned patterns are formed, and the second planarization thin film is patterned through a patterning process to form a second planarization layer 96 that covers the fourth conductive layer, wherein the second planarization layer 96 is at least provided with a twelfth via V12 (i.e., a first opening) and a thirteenth via V13 (i.e., a second opening), as shown in FIG. 14*a* and FIG. 14*b*, FIG. 14*b* is a schematic plan view of the second planarization layer in FIG. 14*a*.

In some exemplary implementation modes, the twelfth via V12 is located in a region where the anode connection electrode 53 is located, the second planarization layer within the twelfth via is removed to expose a surface of the anode connection electrode 53, and the twelfth via is configured such that a second sub-anode subsequently formed is electrically connected with the first anode connection electrode 53 through the via.

In some exemplary implementation modes, the thirteenth via V13 is located in a region where the second anode connection electrode 54 is located, the second planarization layer within the thirteenth via V13 is removed to expose a surface of the second anode connection electrode 54, and the thirteenth via V13 is configured such that a second anode subsequently formed is electrically connected with the second anode connection electrode 54 through the via.

In some exemplary implementation modes, an area of an orthographic projection of the twelfth via V12 on the base substrate 10 is greater than an area of an orthographic projection of the thirteenth via V13 on the base substrate 10.

In an exemplary embodiment, a size and a shape of the twelfth Via V12 may be close to or the same as the size and the shape of the first anode 61 subsequently formed. During actual use, the twelfth via V12 may be made as large as possible so that a contact area between the first anode connection electrode 53 and the first anode 61 subsequently formed is increased as much as possible, to reduce its resistance and improve a light emitting efficiency of a light emitting device connected with the first anode 61. A size and a shape of the thirteenth via V13 may be determined according to a size and a shape of the second anode connection electrode 54, as long as the thirteenth via V13 can expose a surface of the second anode connection electrode 54.

At this point, preparation of a pattern of a drive circuit layer 102 in FIG. 6*a* on the base substrate 10 is completed. In a plane parallel to the display substrate, the drive circuit layer 102 may include multiple circuit units, each circuit unit may include a pixel drive circuit, and a first scan signal line, a second scan signal line, a light emitting control line, a data signal line, a first power line, an initial signal line, etc. that are connected with the pixel drive circuit. In a plane perpendicular to the display substrate, the drive circuit layer 102 may include a first insulation layer 91, a semiconductor layer, a second insulation layer 92, a first conductive layer, a third insulation layer 93, a second conductive layer, a fourth insulation layer 94, a third conductive layer, a first planarization layer 95, a fourth conductive layer, and the second planarization layer 96 which are stacked sequentially on the base substrate 10.

In an exemplary embodiment, after the preparation of the drive circuit layer 102 is completed, a light emitting structure layer 103 is prepared on the drive circuit layer 102, and a preparation process of the light emitting structure layer 103 may include following operations.

Figure 15A:
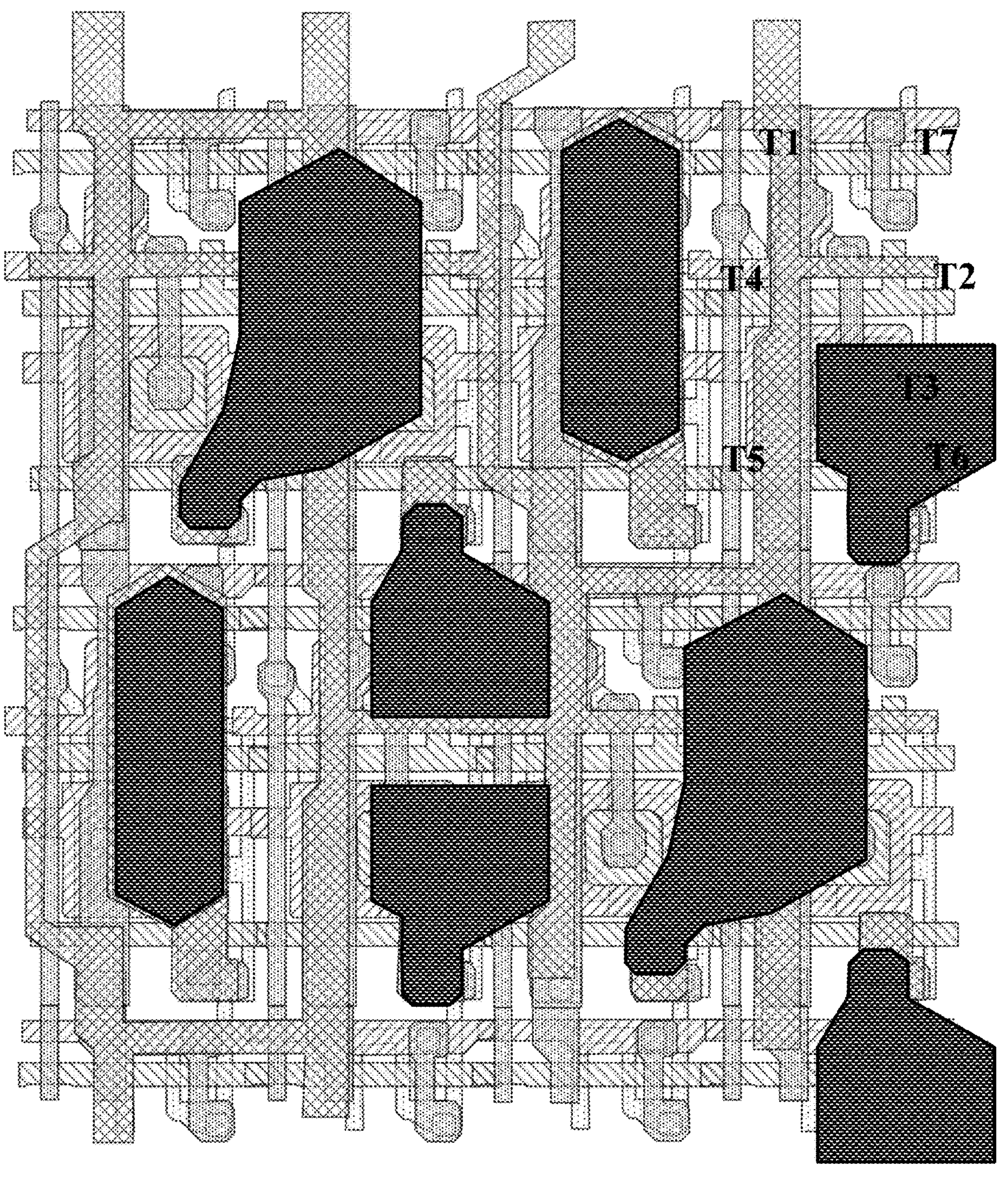
FIG. 15*a* is a schematic diagram of a structure of the display substrate shown in FIG. 5 after an anode layer is formed.
Figure 15B:
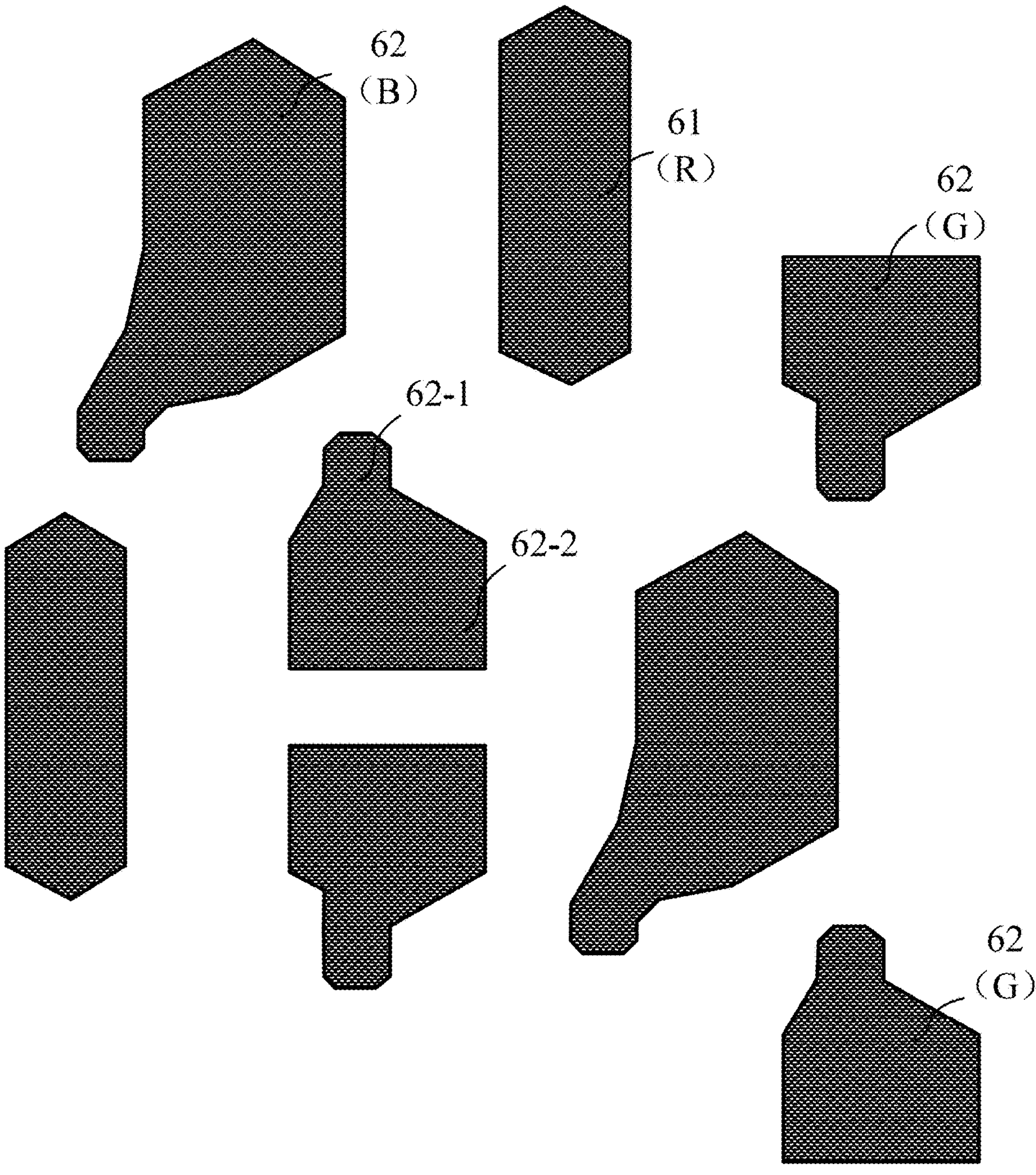
FIG. 15*b* is a schematic diagram of a structure of the anode layer in the display substrate shown in FIG. 5.

(9) A pattern of an anode layer is formed. In some exemplary implementation modes, forming a pattern of an anode layer may include: a transparent conductive thin film is deposited on the base substrate on which the aforementioned patterns are formed, and the transparent conductive thin film is patterned through a patterning process to form an anode layer disposed on the second planarization layer, as shown in FIG. 15*a* and FIG. 15*b*, and FIG. 15*b* is a schematic plan view of the anode layer in FIG. 15*a*.

In some exemplary implementation modes, the anode layer includes a first anode 61 and a second anode 62, the first anode 61 is connected with the first anode connection electrode 53 through the twelfth via V12, and the second anode 62 is connected with the second anode connection electrode 54 through the thirteenth via V13. Since an anode connection electrode (the first anode connection electrode 53 or the second anode connection electrode 54) is electrically connected with the first connection electrode 43 through the eleventh via V11 and the first connection electrode 43 is connected with the second region of the sixth active layer (which is also the second region of the seventh active layer) through the fourth via V4, it is achieved that a pixel circuit may drive a light emitting device to emit light.

In some exemplary implementation modes, the second anode 62 includes an anode main body part 62-2 and an anode protrusion part 62-1 disposed on the anode main body part 62-2, there is no overlapping region between an orthographic projection of the anode main body part 62-2 on the base substrate 10 and an orthographic projection of the second anode connection electrode 54 on the base substrate 10, there is an overlapping region between an orthographic projection of the anode protrusion part 62-1 on the base substrate 10 and the orthographic projection of the second anode connection electrode 54 on the base substrate 10, and the second anode connection electrode 54 is connected with the anode protrusion part 62-1 through the thirteenth via V13.

In an exemplary embodiment, a shape of the anode main body part 62-2 may be pentagonal-like or hexagonal-like. The anode protrusion part 62-1 may be a rectangle projecting toward and close to a second anode connection electrode 54 in a pixel drive circuit connected thereto.

In some exemplary implementation modes, the display substrate includes multiple pixel units, each pixel unit includes multiple sub-pixels, each sub-pixel includes a circuit unit and a light emitting device, each light emitting device includes a red (R) light emitting device that emits red light, a blue (B) light emitting device that emits blue light, and a green (G) light emitting device that emits green light. Each circuit unit includes a first circuit unit connected with the red light emitting device, a second circuit unit connected with the blue light emitting device, and a third circuit unit connected with the green light emitting device.

The first circuit unit includes a first anode connection electrode 53 and the red light emitting device includes a first anode 61; the second circuit unit includes a second anode connection electrode 54 and the blue light emitting device includes a second anode 62; the third circuit unit includes a second anode connection electrode 54 and the green light emitting device includes a second anode 62.

In some exemplary implementation modes, each pixel unit includes one first circuit unit, one second circuit unit, and two third circuit units. Multiple circuit units form multiple unit rows and multiple unit columns, the unit columns include a first unit column and a second unit column, the first unit column includes multiple first circuit units and second circuit units alternately arranged along the second direction Y, and the second unit column includes multiple third circuit units arranged along the second direction Y.

In some exemplary implementation modes, a subsequent preparation process may include: a pixel definition thin film is coated, and the pixel definition thin film is patterned through a patterning process to form a Pixel Definition Layer (PDL). A pixel definition layer of each sub-pixel is provided with a Sub-pixel Aperture (SA) and the sub-pixel aperture exposes an anode. An organic emitting layer is formed using an evaporation or ink-jet printing process, and a cathode, an anode, a pixel definition layer, an organic emitting layer, and a cathode are formed on the organic emitting layer to form a pattern of a light emitting structure layer 103 in FIG. 6*a*. A pattern of an encapsulation layer 104 is formed, as shown in FIG. 6*a*, the encapsulation layer 104 may include a first encapsulation layer, a second encapsulation layer, and a third encapsulation layer that are stacked. The first encapsulation layer and the third encapsulation layer may be made of an inorganic material and the second encapsulation layer may be made of an organic material. The second encapsulation layer is disposed between the first encapsulation layer and the third encapsulation layer, which may ensure that outside water vapor cannot enter the light emitting structure layer.

In some exemplary implementation modes, the subsequent preparation process may also include: a pattern of a touch structure layer 105 is formed on the base substrate on which the aforementioned patterns are formed, as shown in FIG. 5 and FIG. 6*a*. The touch structure layer 105 may include a buffer layer, a first touch electrode layer (i.e., a bridging layer), a touch dielectric layer (TLD), a second touch electrode layer, and a protective layer that are stacked on the encapsulation layer 104, multiple first touch electrodes, multiple second touch electrodes, and multiple first connection parts may be disposed in a same layer and in the second touch electrode layer, and may be formed through a same patterning process, and a first touch electrode and a first connection part may be connected with each other to form an integral structure. A second connection part may be disposed in the first touch electrode layer to make adjacent second touch electrodes connected with each other through a via, and a touch dielectric layer is disposed between the second touch electrode layer and the first touch electrode layer. In some possible implementation modes, multiple first touch electrodes, multiple second touch electrodes, and multiple second connection parts may be disposed in a same layer and in the second touch electrode layer, a second touch electrode and a second connection part may be connected with each other to form an integral structure, and the first connection part may be disposed in the first touch electrode layer to make adjacent first touch electrodes connected with each other through a via.

In an exemplary implementation mode, as shown in FIG. 6*d*, the second touch electrode layer includes multiple grid patterns, and at least one grid pattern includes a first touch branch 71, the first touch branch 71 extends along the second direction Y, there is an overlapping region between an orthographic projection of the first touch branch 71 on the base substrate and the orthographic projection of the second branch 51 of the first power line on the base substrate, and there is no overlapping region between the orthographic projection of the first touch branch 71 on the base substrate and the orthographic projection of the first branch 41 of the first power line on the base substrate.

In an exemplary implementation mode, the at least one grid pattern further includes a second touch branch 72, there is an overlapping region among three, that is, an orthographic projection of the second touch branch 72 on the base substrate, the orthographic projection of the second branch 51 of the first power line on the base substrate, and the orthographic projection of the first branch 41 of the first power line on the base substrate.

In an exemplary implementation mode, when a flexible display substrate is prepared, a preparation process of the display substrate may include processes such as peeling a glass carrier board, attaching a back film, and cutting, the present disclosure is not limited thereto.

In some exemplary implementation modes, a base substrate may be a flexible base substrate or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In some exemplary implementation modes, the flexible base substrate may include a first flexible material layer, a first inorganic material layer, a semiconductor layer, a second flexible material layer, and a second inorganic material layer which are stacked. Materials of the first flexible material layer and the second flexible material layer may be Polyimide (PI), Polyethylene Terephthalate (PET), or a surface-treated polymer soft film, etc.; and materials of the first inorganic material layer and the second inorganic material layer may be Silicon Nitride (SiNx) or Silicon Oxide (SiOx), etc., thereby improving water-resistance and oxygen-resistance of the base substrate. A material of the semiconductor layer may be amorphous silicon (a-si).

In some exemplary implementation modes, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be of a single-layer structure, or a multi-layer composite structure such as Mo/Cu/Mo. The anode layer may be made of a transparent conductive material, such as Indium Tin Oxide (ITO) or Indium Zinc Oxide (IZO). The first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer is called a buffer (BUF) layer, which is used for improving water-resistance and oxygen-resistance of the base substrate, the second insulation layer is called a first gate insulation (GI1) layer, the third insulation layer is called a second gate insulation (GI2) layer, and the fourth insulation layer is called an Interlayer Dielectric (ILD) layer. The first planarization (PLN1) layer and the second planarization (PLN2) layer may be made of an organic material. The semiconductor layer may be made of polycrystalline Silicon (p-Si) or oxide.

According to the display substrate of the embodiment of the present disclosure, the area of the orthographic projection of the first anode connection electrode on the base substrate is greater than the area of the orthographic projection of the second anode connection electrode on the base substrate and the area of the orthographic projection of the first opening on the base substrate is greater than the area of the orthographic projection of the second opening on the base substrate, so that a light emitting efficiency of a light emitting device is effectively improved and power consumption is saved. In addition, a preparation process in the present disclosure may be compatible well with an existing preparation process, which is simple in process implementation, is easy to implement, and has a high production efficiency, a low production cost, and a high yield.

Figure 16A:
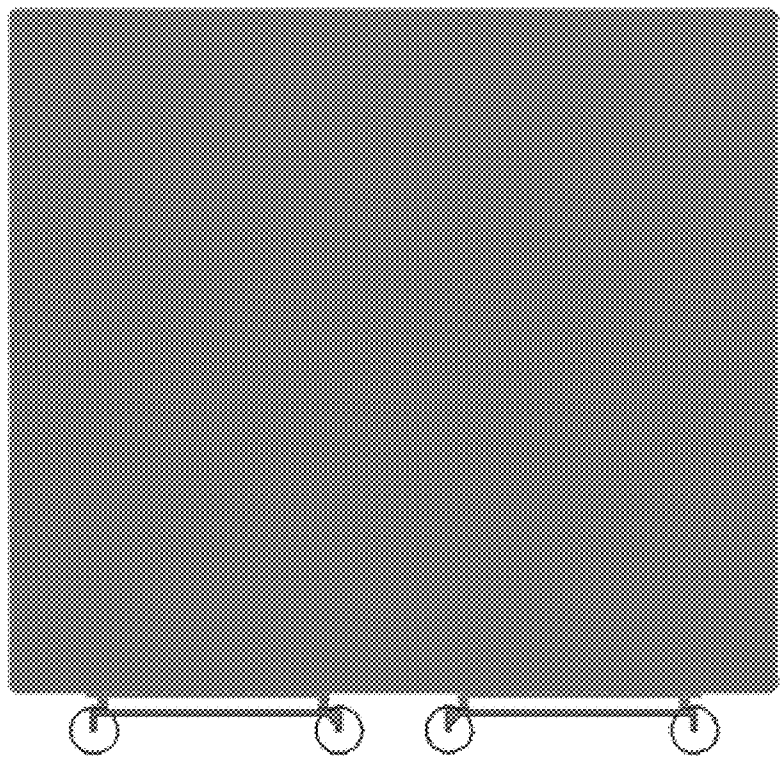
FIG. 16*a* is a diagram of a voltage drop simulation result of a first power line (VDD) in a display substrate according to an embodiment of the present disclosure.
Figure 16B:
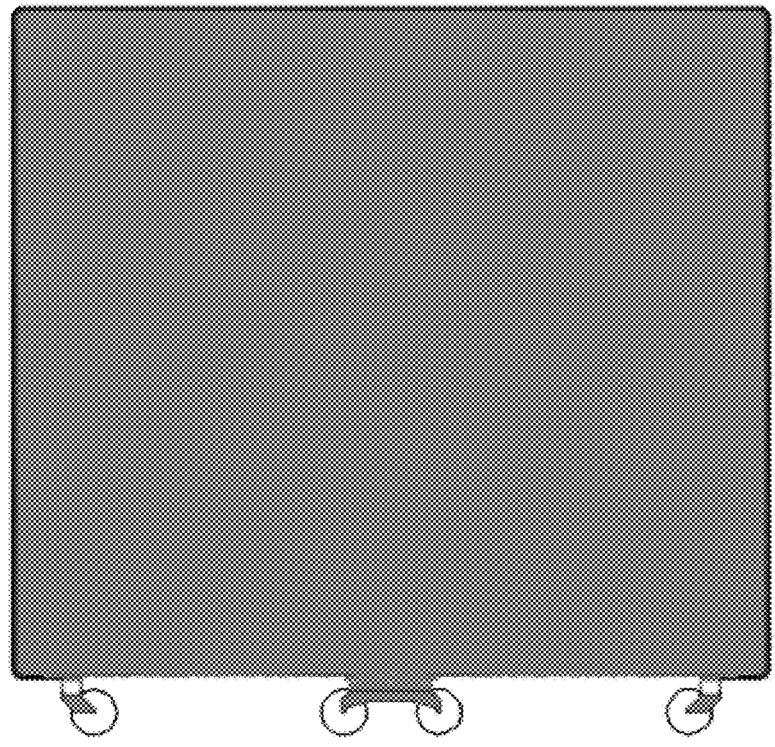
FIG. 16*b* is a diagram of a voltage drop simulation result of a second power line (VSS) in a display substrate according to an embodiment of the present disclosure.

Table 1 is a simulation result of Long Range Uniformity (LRU) of a first power line (VDD) and a second power line (VSS) of a display substrate according to an embodiment of the present disclosure and FIG. 16*a* is a simulation result diagram of IR Drop of the first power line (VDD). FIG. 16*b* is a simulation result diagram of IR Drop of the second power line (VSS). As may be seen from Table 1, FIG. 16*a*, and FIG. 16*b*, voltage drop (IR Drop) of both VDD and VSS in the display substrate of the embodiment of the present disclosure is reduced and the LRU is improved.

TABLE 1

| | | VDD drop (V) | | | | VSS drop (V) | | | | |
|---|---|---|---|---|---|---|---|---|---|---|
| Settings | | AA | IC to AA | Total | IVDD/mA | AA | IC to AA | Total | IVSS/mA | LRU |
| L255 | 450 nit | 0.0374 | 0.0253 | 0.0627 | 449.323 | 0.8708 | 0.1542 | 1.0250 | 448.187 | 93.24% |
| L255 | 450 nit | 0.03675 | 0.01832 | 0.05507 | 442.113 | 0.56243 | 0.05094 | 0.61337 | 442.113 | 94.012% |

The structure of the display substrate in the present disclosure and the preparation process thereof are only exemplary explanations. In some exemplary implementation modes, change of a corresponding structure and addition or reduction of a patterning process may be performed as practically required, which is not limited in the present disclosure herein. The structure of the display substrate shown in the present disclosure and the preparation process thereof are described by taking an 8T1C pixel circuit shown in FIG. 3 as an example. In other exemplary implementation modes, the pixel circuit may be of a structure of 3T1C, 4T1C, 5T1C, 5T2C, 6T1C, or 7T1C, etc., which is not limited in the present disclosure herein.

The present disclosure also provides a preparation method of a display substrate, for preparing the display substrate provided by the foregoing embodiments. In some exemplary implementation modes, the preparation method of the display substrate may include following acts.

A semiconductor layer is formed on a base substrate, wherein the semiconductor layer includes active layers of multiple transistors.

A fourth conductive layer is formed on the semiconductor layer, wherein the fourth conductive layer includes a first anode connection electrode and a second anode connection electrode.

A second planarization layer is formed on the fourth conductive layer, wherein the second planarization layer includes a first opening and a second opening.

An anode layer is formed on the second planarization layer, the anode layer includes a first anode and a second anode, the first anode connection electrode is connected with the first anode through the first opening, and the second anode connection electrode is connected with the second anode through the second opening; an area of an orthographic projection of the first anode connection electrode on the base substrate is greater than an area of an orthographic projection of the second anode connection electrode on the base substrate, and an area of an orthographic projection of the first opening on the base substrate is greater than an area of an orthographic projection of the second opening on the base substrate.

For the display substrate prepared by the preparation method of the display substrate provided by the present disclosure, its implementation principle and implementation effect are similar as those of the display substrate described above, and will not be repeated herein.

The present disclosure also provides a display apparatus which includes the aforementioned display substrate. The display apparatus may be any product or component with a display function, such as a mobile phone, a tablet computer, a television, a display, a laptop computer, a digital photo frame, or a navigator, and the embodiment of the present disclosure is not limited thereto.

Although the implementation modes disclosed in the present disclosure are described as above, the described contents are only implementation modes which are used for facilitating understanding of the present disclosure, but are not intended to limit the present disclosure. Any skilled person in the art to which the present disclosure pertains may make any modifications and variations in forms and details of implementations without departing from the spirit and scope of the present disclosure. However, patent protection scope of the present disclosure should be subject to the scope defined in the appended claims.

The invention claimed is:

1. A display substrate, comprising: a base substrate, a semiconductor layer, a fourth conductive layer, a second planarization layer, and an anode layer sequentially disposed on the base substrate;

the semiconductor layer comprises active layers of multiple transistors, the fourth conductive layer comprises a first anode connection electrode and a second anode connection electrode, the second planarization layer comprises a first opening and a second opening, the anode layer comprises a first anode and a second anode, the first anode connection electrode is connected with the first anode through the first opening, and the second anode connection electrode is connected with the second anode through the second opening;

an area of an orthographic projection of the first anode connection electrode on the base substrate is greater than an area of an orthographic projection of the second anode connection electrode on the base substrate and an area of an orthographic projection of the first opening on the base substrate is greater than an area of an orthographic projection of the second opening on the base substrate.

2. The display substrate according to claim 1, wherein the first anode connection electrode comprises an electrode main body part and an electrode protrusion part disposed on the electrode main body part, wherein there is an overlapping region between an orthographic projection of the electrode main body part on the base substrate and an orthographic projection of the first anode on the base substrate and there is no overlapping region between an orthographic projection of the electrode protrusion part on the base substrate and the orthographic projection of the first anode on the base substrate.

3. The display substrate according to claim 2, wherein the base substrate is further provided with a third conductive layer, the third conductive layer comprises multiple first connection electrodes, and there is an overlapping region between the orthographic projection of the electrode protrusion part on the base substrate and an orthographic projection of the first connection electrodes on the base substrate;

in a plane perpendicular to the display substrate, the display substrate further comprises a first planarization layer disposed between the third conductive layer and the fourth conductive layer, and the electrode protrusion part is connected with the first connection electrodes through a via on the first planarization layer.

4. The display substrate according to claim 3, there is an overlapping region between the orthographic projection of the second anode connection electrode on the base substrate and the orthographic projection of the first connection electrodes on the base substrate and the second anode connection electrode is connected with the first connection electrodes through a via on the first planarization layer.

5. The display substrate according to claim 1, wherein the second anode comprises an anode main body part and an anode protrusion part disposed on the anode main body part, there is no overlapping region between an orthographic projection of the anode main body part on the base substrate and the orthographic projection of the second anode connection electrode on the base substrate, there is an overlapping region between an orthographic projection of the anode protrusion part on the base substrate and the orthographic projection of the second anode connection electrode on the base substrate, the second anode connection electrode is connected with the anode protrusion part through the second opening.

6. The display substrate according to claim 1, wherein the display substrate comprises multiple pixel units, at least one of the pixel units comprises multiple sub-pixels, at least one of the sub-pixels comprises a circuit unit and a light emitting device, at least one of light emitting devices comprises a red light emitting device that emits red light, a blue light emitting device that emits blue light, and a green light emitting device that emits green light, at least one of circuit units comprises a first circuit unit connected with the red light emitting device, a second circuit unit connected with the blue light emitting device, and a third circuit unit connected with the green light emitting device;

the first circuit unit comprises a first anode connection electrode and the red light emitting device comprises a first anode; the second circuit unit comprises a second anode connection electrode; the third circuit unit comprises a second anode connection electrode, and the blue light emitting device and/or the green light emitting device comprises a second anode.

7. The display substrate according to claim 6, wherein at least one of the pixel units comprises one first circuit unit, one second circuit unit, and two third circuit units, multiple circuit units form multiple unit rows and multiple unit columns, the unit columns comprise a first unit column and a second unit column, the first unit column comprises multiple first circuit units and second circuit units alternately arranged along a second direction, the second unit column comprises multiple third circuit units arranged along the second direction.

8. The display substrate according to claim 1, wherein the base substrate is further provided with a third conductive layer, the third conductive layer comprises a first branch of a first power line, the fourth conductive layer further comprises a second branch of the first power line, wherein there is an overlapping region between an orthographic projection of the first branch of the first power line on the base substrate and an orthographic projection of the second branch of the first power line on the base substrate; the first branch of the first power line is electrically connected with the second branch of the first power line through a via.

9. The display substrate according to claim 8, in a plane perpendicular to the display substrate, the display substrate further comprises a touch structure layer disposed on the anode layer, the touch structure layer comprises multiple grid patterns, and at least one of the grid patterns comprises a first touch branch, wherein there is an overlapping region between an orthographic projection of the first touch branch on the base substrate and the orthographic projection of the second branch of the first power line on the base substrate and there is no overlapping region between the orthographic projection of the first touch branch on the base substrate and the orthographic projection of the first branch of the first power line on the base substrate.

10. The display substrate according to claim 9, at least one of the grid patterns comprises a second touch branch, wherein there is an overlapping region among three, that is, an orthographic projection of the second touch branch on the base substrate, the orthographic projection of the second branch of the first power line on the base substrate, and the orthographic projection of the first branch of the first power line on the base substrate.

11. The display substrate according to claim 8, the fourth conductive layer further comprising a power connection electrode, wherein the power connection electrode extends along a first direction, the second branch of the first power line extends along a second direction, and second branches of two adjacent first power lines are connected through one or more of power connection electrodes.

12. The display substrate according to claim 8, wherein there is no overlapping region between an orthographic projection of the first anode on the base substrate and the orthographic projection of the second branch of the first power line on the base substrate; there is an overlapping region between an orthographic projection of the second anode on the base substrate and the orthographic projection of the second branch of the first power line on the base substrate.

13. The display substrate according to claim 8, wherein the second branch of the first power line is provided with a bending part, and the bending part is configured such that a distance of second branches of two first power lines on both sides of the first anode along a first direction in a region of the first anode is greater than a distance along the first direction in a region other than the region of the first anode.

14. The display substrate according to claim 8, wherein a width of the second branch of the first power line in a region close to the first anode is smaller than a width of the second branch of the first power line in a region away from the first anode.

15. A display apparatus, comprising a display substrate according to claim 1.

16. A display apparatus, comprising a display substrate according to claim 2.

17. A display apparatus, comprising a display substrate according to claim 5.

18. A display apparatus, comprising a display substrate according to claim 6.

19. A display apparatus, comprising a display substrate according to claim 8.

20. A preparation method of a display substrate, comprising:

forming a semiconductor layer on a base substrate, wherein the semiconductor layer comprises active layers of multiple transistors;

forming a fourth conductive layer on the semiconductor layer, wherein the fourth conductive layer comprises a first anode connection electrode and a second anode connection electrode;

forming a second planarization layer on the fourth conductive layer, wherein the second planarization layer comprises a first opening and a second opening; and forming an anode layer on the second planarization layer, wherein the anode layer comprises a first anode and a second anode, the first anode connection electrode is connected with the first anode through the first opening, and the second anode connection electrode is connected with the second anode through the second opening; an area of an orthographic projection of the first anode connection electrode on the base substrate is greater than an area of an orthographic projection of the second anode connection electrode on the base substrate, and an area of an orthographic projection of the first opening on the base substrate is greater than an area of an orthographic projection of the second opening on the base substrate.

* * * * *